(12) United States Patent
Nagaki et al.

(10) Patent No.: US 7,079,999 B2
(45) Date of Patent: Jul. 18, 2006

(54) BUS SIMULATION APPARATUS AND BUS SIMULATION PROGRAM

(75) Inventors: Tukasa Nagaki, Hiroshima (JP); Katsumi Tsurumoto, Hiroshima (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 747 days.

(21) Appl. No.: 10/197,207

(22) Filed: Jul. 18, 2002

(65) Prior Publication Data

US 2003/0028362 A1 Feb. 6, 2003

(30) Foreign Application Priority Data

Jul. 19, 2001 (JP) ............................ 2001-219887

(51) Int. Cl.
  *G06F 13/14* (2006.01)
  *G06F 13/42* (2006.01)
  *G06G 7/62* (2006.01)
(52) U.S. Cl. ........................... 703/20; 703/21; 703/13; 710/268
(58) Field of Classification Search .................. 703/21, 703/20, 13
See application file for complete search history.

(56) References Cited

U.S. PATENT DOCUMENTS

| | | | | |
|---|---|---|---|---|
| 5,293,488 A | * | 3/1994 | Riley et al. .................. 709/244 |
| 5,548,785 A | * | 8/1996 | Fogg et al. .................... 710/21 |
| 5,615,136 A | * | 3/1997 | Baraton et al. ................ 703/21 |
| 5,752,002 A | * | 5/1998 | Naidu et al. .................. 703/14 |
| 5,812,824 A | * | 9/1998 | Dearth et al. ................. 703/14 |
| 5,881,267 A | * | 3/1999 | Dearth et al. ................. 703/27 |
| 6,123,735 A | * | 9/2000 | Raghavan et al. ............. 703/21 |
| 6,263,301 B1 | * | 7/2001 | Cox et al. ..................... 703/14 |
| 6,366,964 B1 | * | 4/2002 | Shima et al. ................... 710/8 |
| 6,434,517 B1 | * | 8/2002 | Le .............................. 703/21 |
| 6,442,514 B1 | * | 8/2002 | Le .............................. 703/21 |
| 6,480,917 B1 | * | 11/2002 | Moertl et al. ............... 710/243 |
| 6,501,761 B1 | * | 12/2002 | Pannell et al. ................ 710/52 |
| 6,571,204 B1 | * | 5/2003 | Meyer ......................... 703/14 |
| 6,678,625 B1 | * | 1/2004 | Reise et al. ................. 702/117 |
| 6,694,368 B1 | * | 2/2004 | An et al. ..................... 709/227 |
| 2003/0018464 A1 | * | 1/2003 | Khanna et al. ............... 703/21 |

FOREIGN PATENT DOCUMENTS

JP 7-121405 5/1995

OTHER PUBLICATIONS

Wormhole Routing Techniques for Directly Connected Multicomputer Systems; Prasant Mahapatra; ACM Computer Survey; 1998.*

* cited by examiner

*Primary Examiner*—Fred Ferris
*Assistant Examiner*—Akash Saxena
(74) *Attorney, Agent, or Firm*—McDermott Will & Emery LLP

(57) ABSTRACT

A bus simulation apparatus for simulating a bus connecting a plurality of devices. Each of a plurality of simulated bus slot application interfaces prepares a receive task in response to a call from a simulated device corresponding to each of the plurality of devices. The receive task obtains a communication handle for an application name of the simulated device. A communication handle management table relates the communication handle to the application name. A simulated bus manager, in response to a request for data transfer between the simulated devices along with the application name, sends data to the receive task of destination using the communication handle obtained by searching the communication handle management table based on the received application name.

8 Claims, 32 Drawing Sheets

FIG. 8A

| SLOT APPLICATION NAME | INTER-PROGRAM COMMUNIATION HANDLE |
|---|---|
| ........ | ........ |
| ........ | ........ |

FIG. 8B

| SLOT APPLICATION NAME | INTER-PROGRAM COMMUNIATION HANDLE |
|---|---|
| "micon" | handle_micon |
| ........ | ........ |

FIG. 8C

| SLOT APPLICATION NAME | INTER-PROGRAM COMMUNIATION HANDLE |
|---|---|
| "micon" | handle_micon |
| "remocon" | handle_remocon |

FIG. 9A

| SOURCE APPLICATION NAME | INTERRUPT-FUCTION POINTER |
|---|---|
| ............ | ............ |
| ............ | ............ |

FIG. 9B

| SOURCE APPLICATION NAME | INTERRUPT-FUCTION POINTER |
|---|---|
| "remocon" | receive_remocon() |
| ............ | ............ |

FIG. 9C

| SOURCE APPLICATION NAME | INTERRUPT-FUCTION POINTER |
|---|---|
| "micon" | receive_micon() |
| ............ | ............ |

FIG. 19

| SOURCE APPLICATION NAME | INTERRUPT-FUNCTION POINTER |
|---|---|
| "micon" | receive_micon() |
| "function2" | function2() |

FIG. 22

| SLOT APPLICATION NAME | SLOT APPLICATIO NAME AFTERCHANGE |
|---|---|
| "remocon" | "remocon2" |
| ......... | ......... |

FIG. 23

| SLOT APPLICATION NAME | BROADCAST SLOT APPLICATION NAME |
|---|---|
| "remocon" | "remocon2" |
| ...... | ...... |

FIG. 26

| SLOT APPLICATION NAME | INTER-PROGRAM COMMUNICATION HANDLE | COMPUTER NAME |
|---|---|---|
| ………… | ………………… | ……… |
| ………… | ………………… | ……… |

FIG. 27

| COMPUTER NAME | INTER-COMPUTER COMMUNICATION HANDLE |
|---|---|
| ...... | ...... |
| ...... | ...... |

FIG. 28A

| COMPUTER NAME | INTER-COMPUTER COMMUNICATION HANDLE |
|---|---|
| "Pana1" | hPana1 |
| ...... | ...... |

FIG. 28B

| COMPUTER NAME | INTER-COMPUTER COMMUNICATION HANDLE |
|---|---|
| "PanaMaster" | hPanaMaster |
| ...... | ...... |

FIG. 30A

| SLOT APPLICATION NAME | INTER-PROGRAM COMMUNICATION HANDLE | COMPUTER NAME |
|---|---|---|
| "micon" | handle_micon | ......... |
| ......... | ......... | ......... |

FIG. 30B

| SLOT APPLICATION NAME | INTER-PROGRAM COMMUNICATION HANDLE | COMPUTER NAME |
|---|---|---|
| "micon" | handle_micon | ......... |
| "remocon" | ......... | PanaMaster |

FIG. 31A

| SLOT APPLICATION NAME | INTER-PROGRAM COMMUNICATION HANDLE | COMPUTER NAME |
|---|---|---|
| "micon" | ......... | Pana1 |
| ......... | ......... | ......... |

FIG. 31B

| SLOT APPLICATION NAME | INTER-PROGRAM COMMUNICATION HANDLE | COMPUTER NAME |
|---|---|---|
| "micon" | ......... | Pana1 |
| "remocon" | handle_remocon | ......... |

BUS SIMULATION APPARATUS AND BUS SIMULATION PROGRAM

BACKGROUND OF THE INVENTION

1. Field of the Invention

This invention relates to a bus simulation apparatus and a bus simulation program for simulating a bus connecting a microprocessor, a peripheral device and the like.

2. Description of the Related Art

For instance, Japanese Laid-open Publication No. 07-121405 discloses the related art wherein a target machine actually operating software is simulated by a multipurpose calculator different from the machine for testing or debugging of the software.

The MPU simulator described in this gazette is for simulating a microprocessor, while an I/O model is for simulating the input and output device. An I/O monitor is for simulating a group of signals for connecting the microprocessor and the input/output device.

These MPU simulator, I/O model and I/O monitor work by means of a separate calculator or a separate process. Therefore, in order to simulate the transmission and receipt of signals between the microprocessor and the input/output device, the inter-calculator communication or the inter-process communication must be performed between the MPU simulator, the I/O model and the I/O monitor. As the inter-calculator communication or the inter-process communication, the socket communication is used, for example.

However, where a procedure for the socket communication or the like is implemented into the MPU simulator, the I/O model and the I/O monitor respectively, the implementation should depend on the connection between the microprocessor and the input/output device. This adversely affects on the preparing performance of the MPU simulator, and etc. In addition, even if the MPU simulator, the I/O model and the I/O monitor is made to work by a separate calculator or a separate process, when any change is made on the design of the connecting relation, it becomes hard to cope with such change by reusing the MPU simulator, the I/O model and the I/O monitor. Likewise, it is hard to port the MPU simulator, the I/O model and the I/O monitor to a system based on the other design. As a matter of course, the more the number of MPU simulators increases, the greater these difficulties become remarkably.

In the socket communication, it occurs that the relation between a server and a client is formed between the communication objects. Where the relations between the server and the client are complicated among the MPU simulator, the I/O model and the I/O monitor, the processing like the debugging is easy to be under the influence of the starting order, and it contributes to the loss of stability of the working performance.

SUMMARY OF THE INVENTION

The invention is proposed in consideration of the above-mentioned subjects of the related arts, and has an object to provide the bus simulation apparatus and bus simulation program which improve the preparing efficiency, the portability and the reusability of the program for simulating a microprocessor, a peripheral device or the like, and moreover which assures the stability of the debugging with ease.

The present invention adopts the following means in order to achieve the above object. That is to say, the invention is provided with communication mediating means in order to simulate a bus connecting plural connected-devices including at least one of a microprocessor and a peripheral device.

The communication mediating means is separated from respective connected-device programs corresponding to each of the connected-devices, and mediates communication between the connected-device programs.

The invention comprises interface providing means. The interface providing means provides to each of the connected-device programs a common interface for communication between the connected-device program and the communication mediating means.

Thereby, the implementation of respective connected-device programs can be centralized, and in result, it is made possible to improve the preparing efficiency, the portability and the reusability of the program. It is possible to control the influence that is caused by the increase of the connected-device programs. Furthermore, since the communication is mediated by the communication mediating means, it is possible to restrain the influence based on the starting order of each connected-device program.

There is a case that the communication mediating means has a specifying table specifying a communication route between the connected-device programs by means of an ID code identifying the connected-device program. The ID code is a name of the connected-device program, for example. And the connected-device program specifies a source and a destination by means of the ID code. In this case, in the connected-device program, the information basically necessary for the communication is hidden by the ID code. That is to say, the connected-device program is not necessary to depend on this necessary information so that it is made possible to improve the preparing efficiency, the portability and the reusability of the program.

At this time, for example, the connected-device program refers to an interrupt-function management table correlating the ID code with an interrupt-function, and executes the interrupt-function. By utilizing the interrupt-function, it is also possible to perform the asynchronous communication and the synchronous communication.

In addition, the interrupt-function management table may correlate the ID code not only with the interrupt-function but also with a export-function for taking a specific function public to other connected-device programs.

In this case, the other connected-device programs utilize the export-function by specifying a function ID code identifying the export-function instead of the ID code. Thereby, even the connected-device program not having the specific function can share the specific function.

There is a case that the invention comprises a communication definition file for defining the communication route between the connected-device programs. In this case, the communication mediating means refers to the communication definition file and changes the communication route or adds the communication route. For instance, the communication mediating means refers to a transfer management table representing the original communication route and the changed communication route that are correlated with each other by the communication definition file, and changes the original communication route to the changed communication route. When the transfer management table is prepared on the memory according to the communication definition file, only editing the communication definition file may be performed in order to change the communication route, and it is not necessary to reconstruct the communication mediating means. And the communication mediating means may refer to a broadcast transmittal management table representing a communication route correlated with a specific communication route by the communication definition file, and add the communication route for broadcast to the specific communication route. When the broadcast transmittal management table is prepared on the memory according to the communication definition file, it is possible to carry out the broadcast communication in a simple way by adding the necessary communication route to the communication definition file.

In case where plural connected-device programs work on different information processors, the communication mediating means is arranged on each information processors, and a communication between the information processors is performed by a communication between the communication mediating means.

Accordingly, the connected-device program does not need to depend on the information such as IP address, which is necessary for the communication between the information processors. In result, even if plural connected-device programs work on different information processors, it is possible to improve the preparing efficiency, the portability and the reusability of the program.

A bus simulation program makes a computer operate as the above-mentioned bus simulation apparatus cooperating with hardware such as CPU or memory of the computer. The bus simulation program can be distributed in a state of storing it in a computer-readable storage medium like CDROM.

BRIEF DESCRIPTION OF THE DRAWINGS

FIGS. 8A, 8B and 8C are diagrams explaining the inter-program communication handle management table.

FIGS. 9A, 9B and 9C are diagrams explaining the interrupt-function management table.

FIG. 19 is a diagram showing a concrete example of the interrupt-function management table including the export-function in the embodiment 2.

FIG. 22 is a diagram showing a concrete example of the transfer management table in the embodiment 3.

FIG. 23 is a diagram showing a concrete example of the broadcast transmittal management table in the embodiment 4.

FIG. 26 is a diagram explaining the inter-program communication handle management table in the embodiment 5.

FIG. 27 is a diagram explaining the inter-computer communication handle management table in the embodiment 5.

FIGS. 28A and 28B are diagrams showing a concrete example of the inter-computer communication handle management table in the embodiment 5.

FIGS. 30A and 30B are diagrams showing a concrete example of the inter-program communication handle management table on the side of the slave in the embodiment 5.

FIGS. 31A and 31B are diagrams showing a concrete example of the inter-program communication handle management table on the side of the master in the embodiment 5.

DESCRIPTION OF THE PREFERRED EMBODIMENTS

The preferred embodiments of the present invention are explained hereafter according to the drawings.

Figure 1:
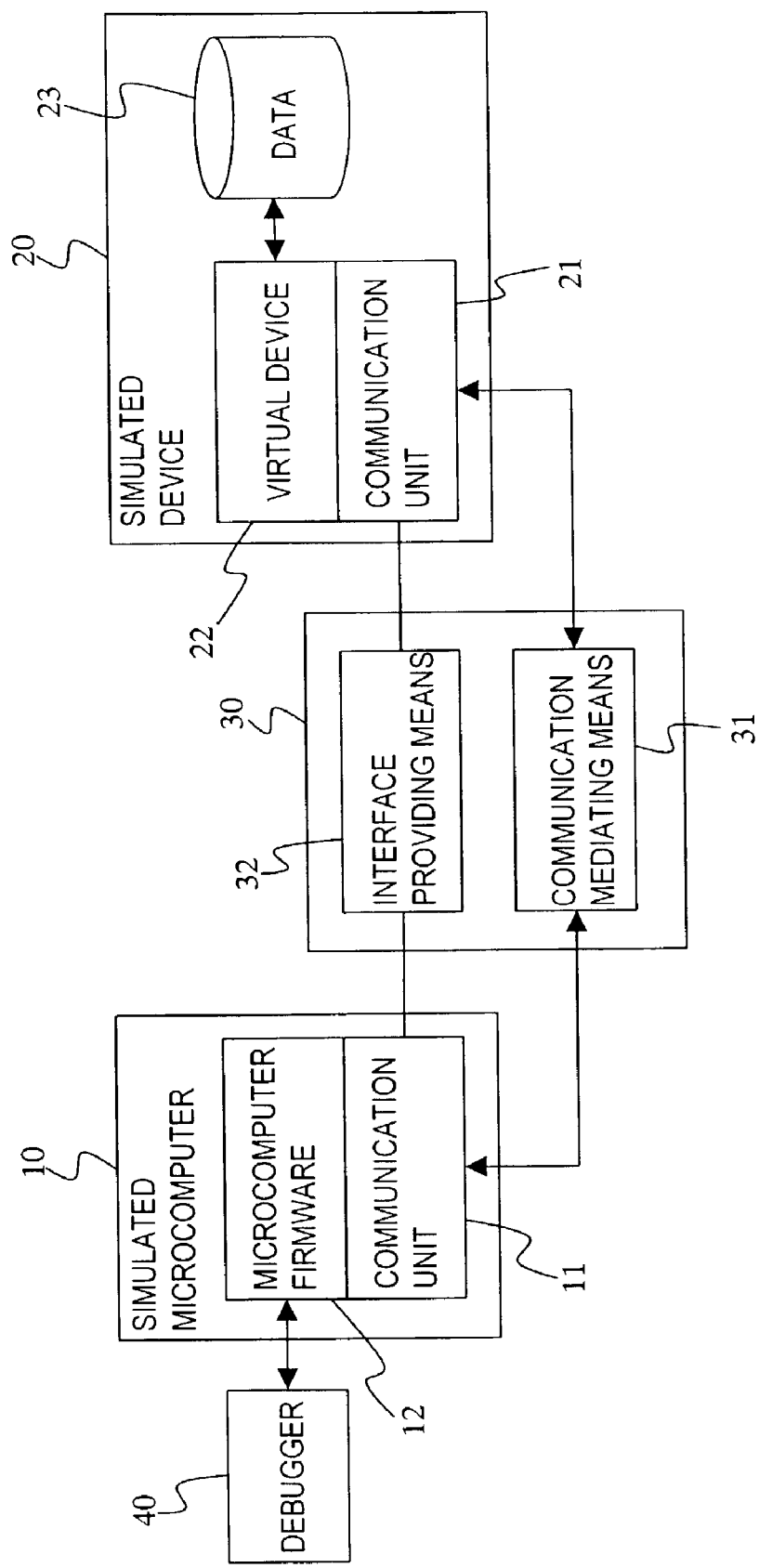
FIG. 1 is a schematic block diagram of the bus simulation apparatus in the embodiment 1.
Figure 2:
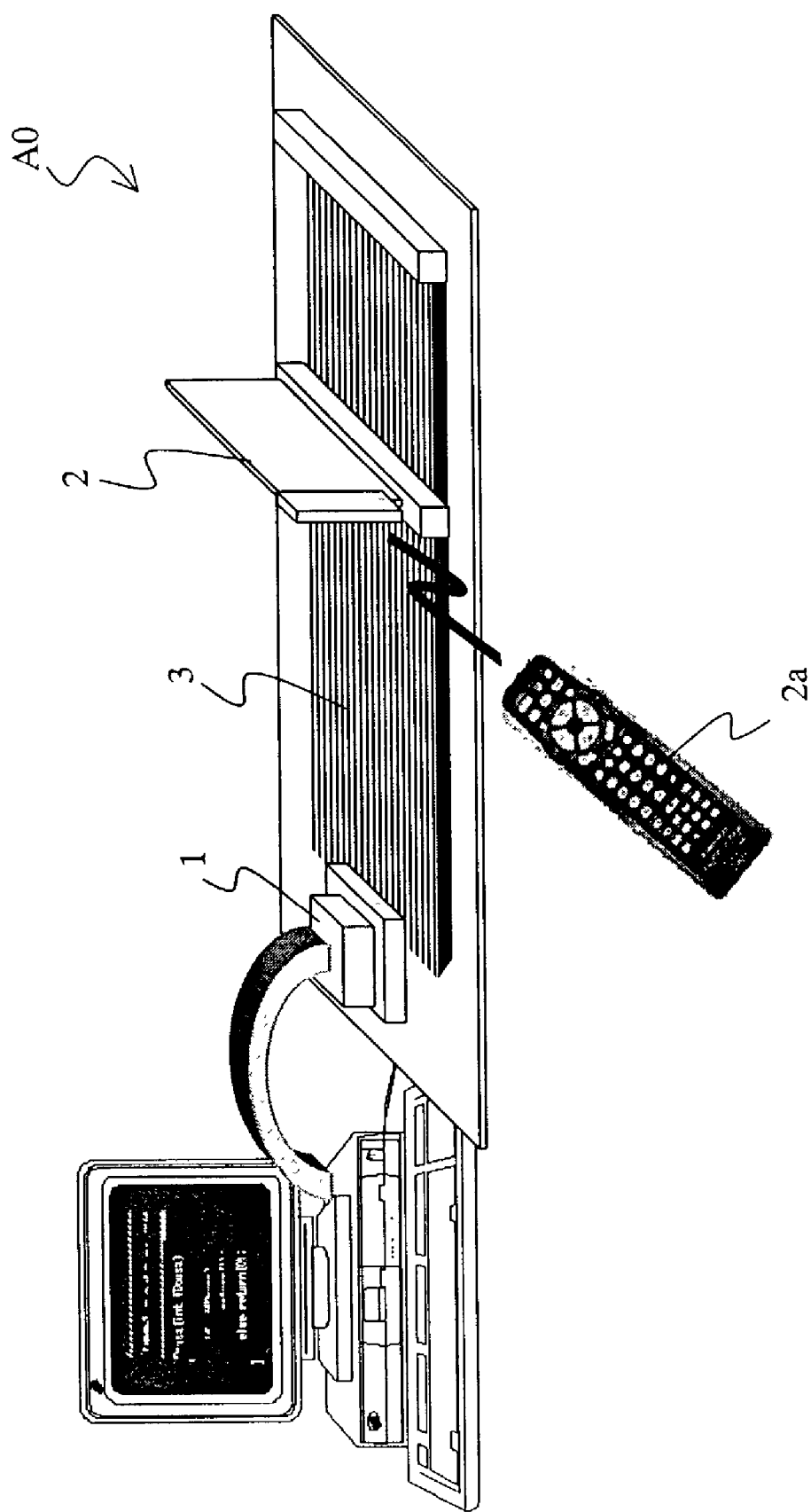
FIG. 2 is a diagram showing an example of outline of an actual microcomputer board.

For instance, on a microcomputer board A0 shown in FIG. 2, a microprocessor 1 is connected with a device 2 for a remote controller 2a through a bus 3. In this embodiment, the invention appears as a bus simulation program for simulating the bus 3. The bus simulation program makes a computer operate at least as a bus simulation apparatus 30 shown in FIG. 1.

In the bus simulation apparatus 30, communication mediating means 31 is separated from a simulated microcomputer 10 and a simulated device 20, and mediates the communication between the simulated microcomputer 10 and the simulated device 20. Interface providing means 32 provides respective communication units 11 and 21 of the simulated microcomputer 10 and the simulated device 20 with a common application interface to communicate with the communication mediating means 31.

The simulated microcomputer 10 is an example of programs for simulating various types of devices connected with the bus 3, and comprises a microcomputer firmware 12 that works in the environment simulating the microprocessor 1. The microcomputer firmware 12 can be debugged by means of a debugger 40. And the simulated microcomputer 10 is provided with the communication unit 11 in addition to the microcomputer firmware 12. The simulated microcomputer 10 communicates with the simulated device 20 by the mediation of the communication mediating means 31 through the communication unit 11.

The simulated device 20 is another example of programs for simulating various types of devices connected with the bus 3, and comprises a virtual device 22 for simulating a device 2 for a remote controller 2*a*. The virtual device 22 simulates an objective device 2 while referring to data 23 such as the key allocation of the remote controller 2*a*. The simulated device 20 comprises the communication unit 21 in addition to the virtual device 22 and the data 23. The simulated device 20 communicates with the simulated device 10 by the mediation of the communication mediating means 31 through the communication unit 21.

For instance, the function of the communication mediating means 31 included in the bus simulation apparatus 30 is implemented onto the computer as a program, and the function of the interface providing means 32 is implemented onto the computer as a common library available for the simulated microcomputer 10 and the simulated device 20 respectively. Regardless of that those programs, the program corresponding to the communication mediating means 31 (which is called a simulated bus manager hereinafter), the simulated microcomputer 10 and the simulated device, can work on a common computer or not, they are implemented independently.

Embodiment 1

This embodiment is based on the assumption that the simulated bus manager, the simulated microcomputer 10 and the simulated device 20 work on a common computer. The communication between respective programs may be performed by a shared memory.

Figure 3:
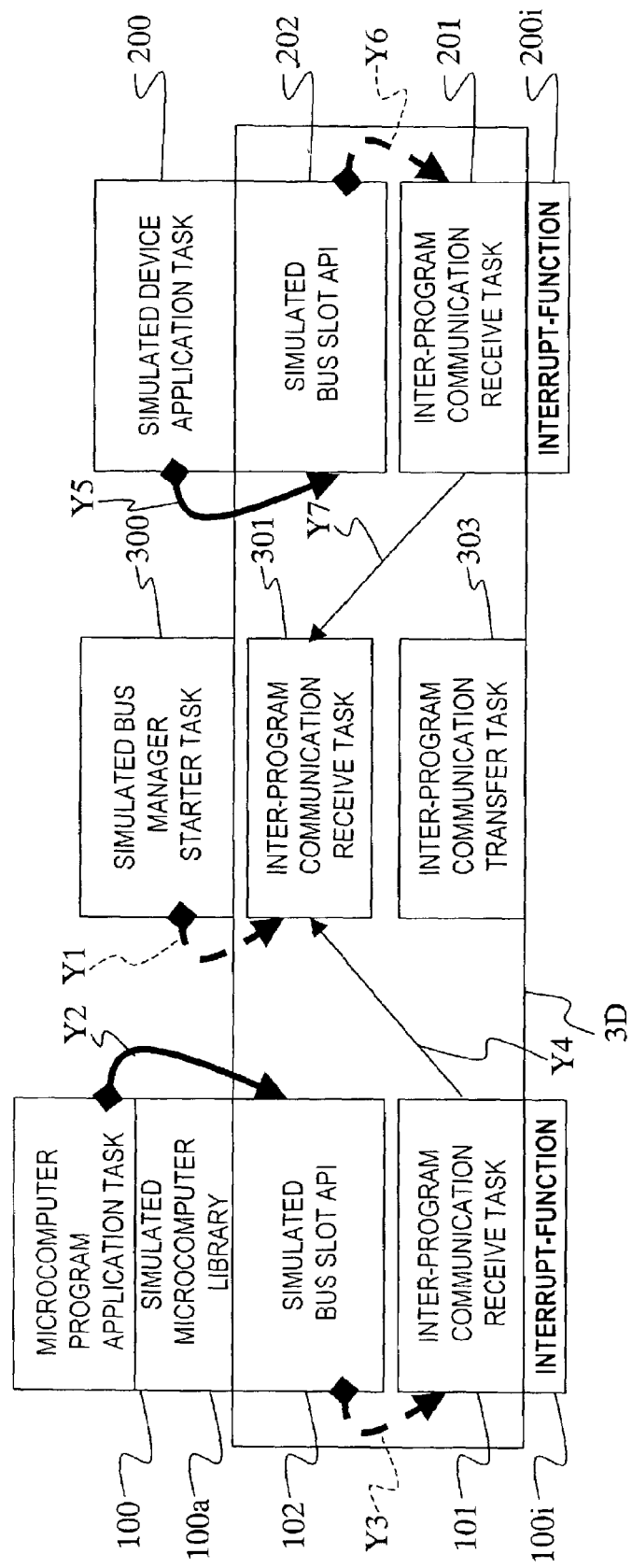
FIG. 3 is a diagram explaining the configuration of the simulated microcomputer board in the embodiment 1.

As shown in FIG. 3, each program of the simulated microcomputer board A1 comprising the simulated bus manager, the simulated microcomputer 10 and the simulated device 20 is handled as a number of tasks by an OS (Operating System) of the computer, for example.

In FIG. 3, the programs that communicate with each other, the simulated bus manager, the simulated microcomputer 10 and the simulated device 20, are separately arranged in the crosswise direction so as to be corresponding to the actual microcomputer board A0 shown in FIG. 2. The tasks correlated with a program are arranged in the lengthwise direction.

The tasks correlated with the simulated bus manager are a simulated bus manager starter task 300, an inter-program communication receive task 301 and an inter-program communication transfer task 303. The inter-program communication receive task 301 and the inter-program communication transfer task 303 out of those are used for the communication with the other programs.

The tasks correlated with the simulated microcomputer 10 are a microcomputer program application task 100 and an inter-program communication receive task 101. The microcomputer program application task 100 is corresponding to the microcomputer firmware 12 of the simulated microcomputer 10. The microcomputer program application task 100 is linked with a simulated microcomputer library 100*a* for simulating the microprocessor 1. The tasks correlated with the simulated microcomputer 10 are linked with the aforementioned common library, and can utilize a simulated bus slot API 102. The simulated bus slot API 102 contains a function to be utilized in the communication with tasks correlated with the simulated bus manager. The inter-program communication receive task 101 is prepared by means of this function. The communication with the tasks correlated with the simulated bus manager is performed by means of the function that the microcomputer program application task 100 calls from the simulated bus slot API 102 or by means of the inter-program communication receive task 101. That is to say, the function called by the microcomputer program application task 100 on the purpose for the communication and the inter-program communication receive task 101 are equivalent to the communication unit 11 of the simulated microcomputer 10.

The tasks correlated with the simulated device 20 are a simulated device application task 200 and an inter-program communication receive task 201. The simulated device application task 200 is corresponding to the virtual device 22. In addition, the task correlated with the simulated device 20 is link with the aforementioned common library, too. The task correlated with the simulated device 20 can utilize a simulated bus slot API 202. The simulated bus slot API 202 is the same as the simulated bus slot interface 102. The inter-program communication receive task 201 is also prepared by means of the function of the simulated bus slot API 202. The communication with the task correlated with the simulated bus manager is performed by means of the function called by the simulated device application task 200 or by means of the inter-program communication receive task 201. That is to say, the function called by the simulated device application task 200 on the purpose for the communication and the inter-program communication receive task 201 are equivalent to the communication unit 21 of the simulated device 20.

Furthermore, the bus 3 is simulated by means of the communication between the respective programs, and the simulated bus 3D comprises the inter-program communication receive task 101, 201 and 301, the inter-program communication transfer task 303, and the functions of the simulated bus slot API 102 and 202 for the inter-program communication.

Of the above-mentioned tasks correlated with the simulated microcomputer board Al, the task that starts up first is the simulated bus manager starter task 300 that is a main task of the starter bus manager.

The started simulated bus manager starter task 300 prepares the inter-program communication receive task 301, as indicated by the dashed thick arrow Y1 in FIG. 3. Besides, the arrows Y1 to Y7 shows the relation between a subject and an object in either case of the preparation, the request to connect or the function calling at the time of the startup. The dashed thick arrows Y1, Y3 and Y6 are relevant to the preparation, the solid thick arrows Y2 and Y5 are relevant to the function calling, and the solid thin arrows Y4 and Y7 are relevant to the request to connect. The figure following the mark Y is based on the working order.

The inter-program communication receive task 301 receives an event from the other programs (which are the simulated microcomputer and the simulated device in this embodiment), and is for performing the processing corresponding to the event.

Figure 4:
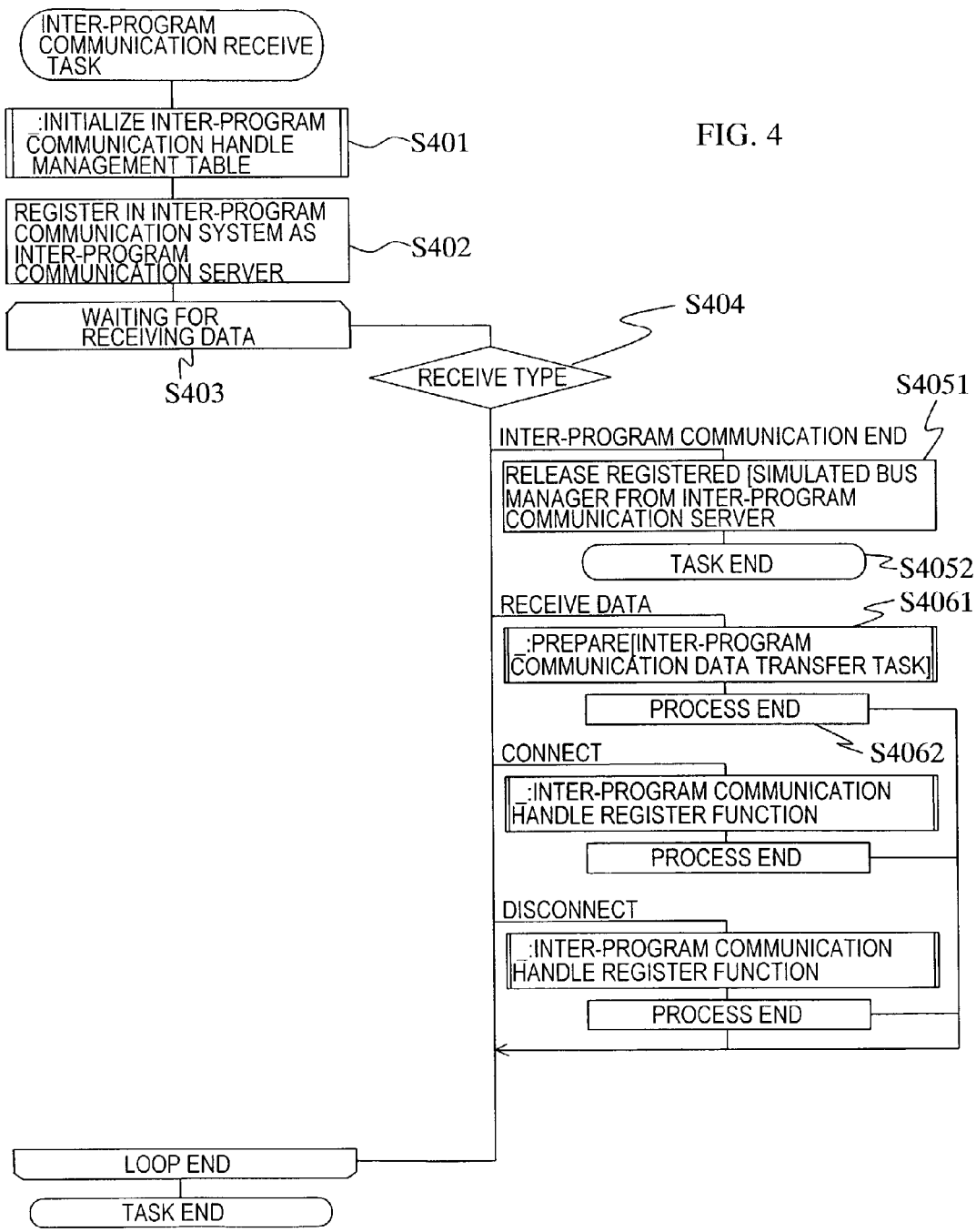
FIG. 4 is a flowchart showing the working procedure of inter-program communication receive task of the simulated bus manager.

FIG. 4 is a flowchart showing the working procedure of the inter-program communication receive task 301.

As shown in FIG. 4, first of all, the inter-program communication receive task 301 initializes an inter-program communication handle management table of the memory (S401). Next, the inter-program communication receive task 301 requests the inter-program communication system provided by OS to register as a server for the inter-program communication in the name of the bus manager name of a reserved word (S402). Thereby, it comes into the state of waiting for the receipt of data from the inter-program communication system (S403).

After the inter-program communication receive task 301 is in the state of waiting for the data, the microcomputer program application task 100 that is a main task of the simulated microcomputer 10 starts up. The started microcomputer program application task 100 calls an inter-program communication task starter function from the simulated bus slot API with a specific slot application name attached, as indicated by the solid thick arrow Y2 in FIG. 3.

Figure 5:
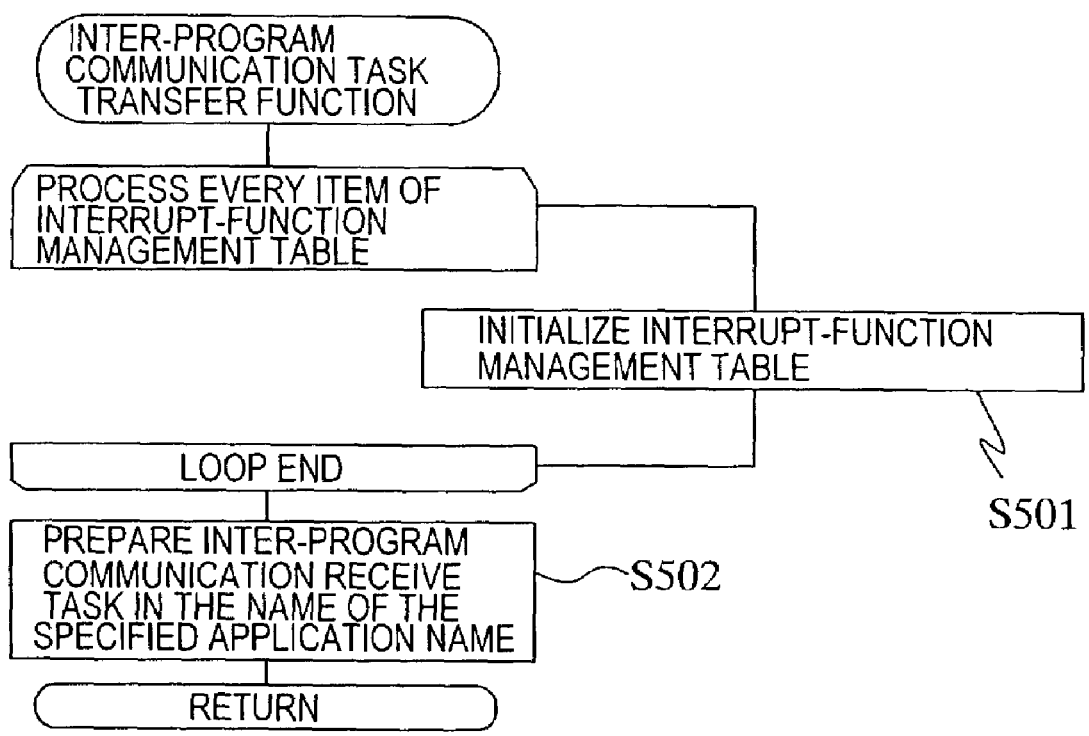
FIG. 5 is a flowchart showing the working procedure of the inter-program communication task starter function.

FIG. 5 is a flowchart showing the working procedure of the inter-program communication task starter function.

As shown in FIG. 5, first of all, the inter-program communication task starter function initializes (all the items of) an interrupt-function management table (S501). Next, the inter-program communication task starter function prepares the inter-program communication receive task 101 (S502), as indicated by the dashed thick arrow Y3 in FIG. 3.

Figure 6:
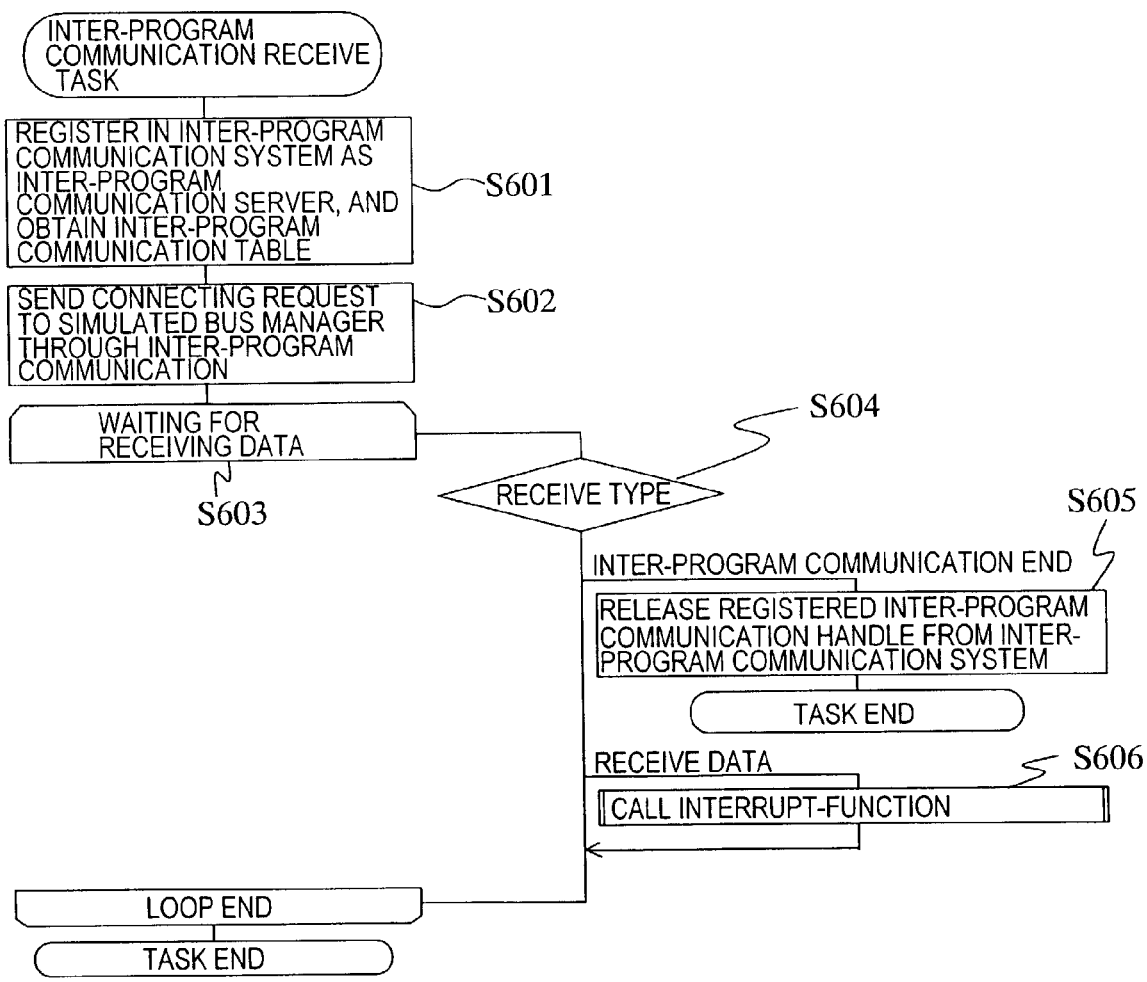
FIG. 6 is a flowchart showing the working procedure of the inter-program communication receive task of the simulated microcomputer or the simulated device.

FIG. 6 is a flowchart showing the working procedure of the inter-program communication receive task 101.

As shown in FIG. 6, the inter-program communication receive task 101 requests the inter-program communication system provided by OS to register as a server for the inter-program communication in the name of a specified slot application name (S601). The slot application name is a name unique to each program utilizing the simulated bus slot API 102 and 202, and for example, the name representing the simulated microcomputer is "micon". The inter-program communication handle obtained corresponding to the slot application name is "handle_micon", for example. Next, the inter-program communication receive task 101 executes the request to connect to the inter-program communication receive task 301 with the slot application name attached, as indicated by the solid thin arrow Y4 in FIG. 3 (S602).

In response to the connecting request from the inter-program communication receive task 101, the inter-program communication receive task 301 of the simulated bus manager judges the receive type (S404).

The receive types of events are four; an inter-program communication end, a data receive, a connection, and a disconnect. The receive type in this embodiment is the connection. If the receive type is the connection, the inter-program communication receive task 301 calls the inter-program communication handle register function (S4071), and then terminates the processing for the connection (S4072). The argument of the inter-program communication handle register function in this case contains the slot application name "micon" attached to the connecting request.

Figure 7:
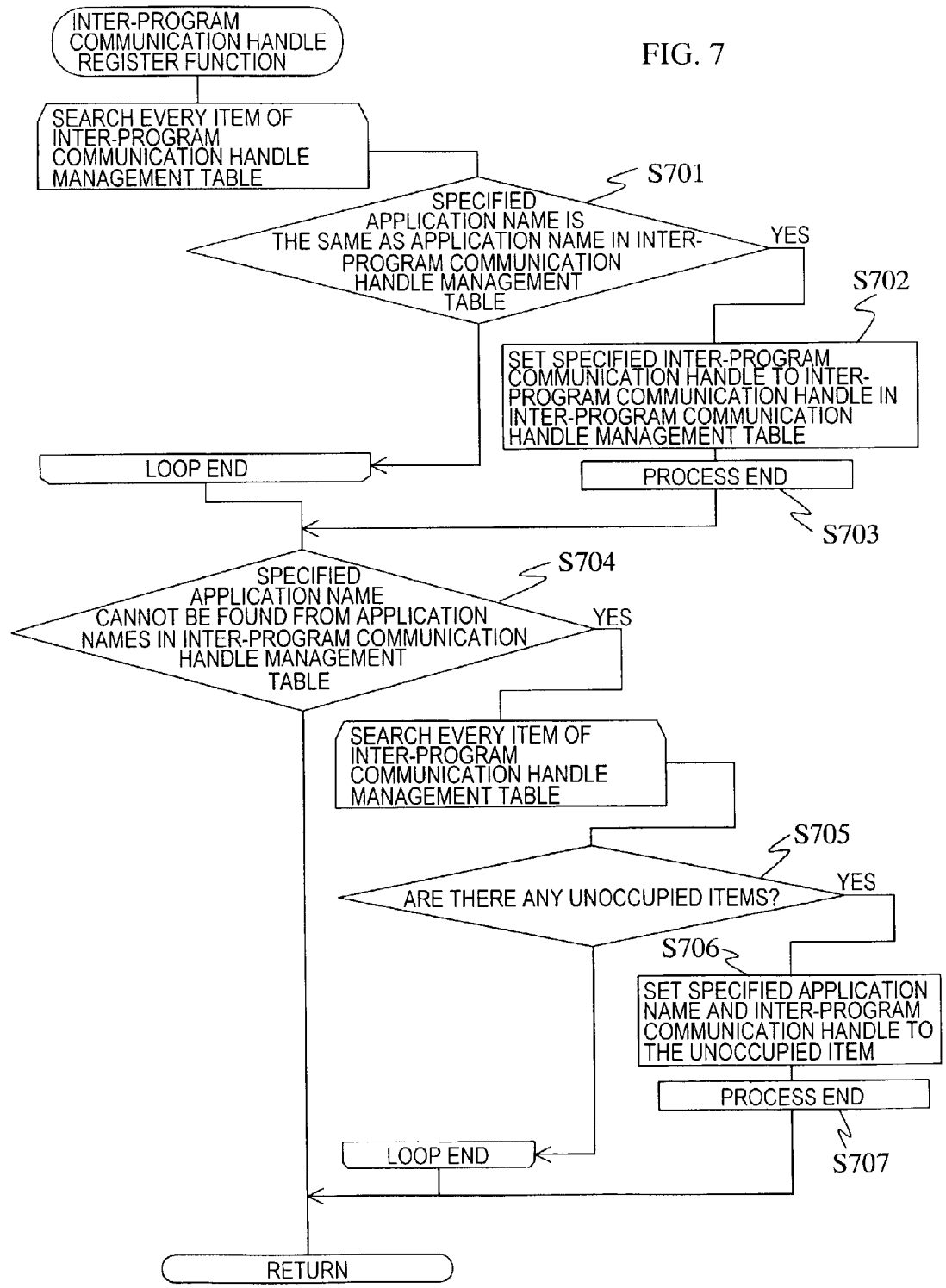
FIG. 7 is a flowchart showing the working procedure of the inter-program communication handle register function.

FIG. 7 is a flowchart showing the working procedure of the inter-program communication handle register function.

As shown in FIG. 7, first, the inter-program communication handle register function searches the slot application name corresponding to the slot application name attached to the connecting request from an inter-program communication handle management table (S701). The inter-program communication handle management table is for correlating the slot application name with the inter-program communication handle as shown in FIG. 8A.

When the corresponding slot application name is found, the inter-program communication handle register function resets to the slot application name the inter-program communication handle of the inter-program communication receive task 301 making the connecting request (S702), and then terminates the searching (S703). On the other hand, if the corresponding slot application name is not found, the slot application name cannot be searched from the inter-program communication handle management table (S704), thereby the inter-program communication handle register function searches whether there is any unoccupied item in the inter-program communication handle management table or not (S705). If the unoccupied item can be found, the inter-program communication handle register function sets to the unoccupied item the slot application name and the inter-program communication handle of the connecting request end (S706), and then terminates the processing (S707).

At this time, the inter-program communication handle management table correlates the slot application name "micon" representing the simulated microcomputer with the inter-program communication handle "handle_micon" as shown in FIG. 8B, for example.

The inter-program communication receive task 101 is connected with the inter-program communication receive task 301 as described above, meanwhile, the inter-program communication receive task 101 of the simulated microcomputer 10 comes into the state of waiting for the receipt of data from the inter-program communication system (S603).

Under the state of waiting for the data, the inter-program communication receive task 101 also judges the receive type of the event (S604), but there is a possibility that the type is only the inter-program communication end. In case of accept the interrupt of the other program (the simulated device 20, in this case), the receive type includes the data receive.

In this case, the started microcomputer program application task 100 calls not only the inter-program communication task starter function but also the interrupt-function setting function out of the simulated bus slot API 102. At the calling, the function is attached with a source application name and an interrupt-function pointer. The interrupt-function setting function registers in an interrupt-function management table the interrupt-function 100*i* used at the receipt of data. The interrupt-function management table is for correlating the source application name with the interrupt-function pointer indicating the interrupt-function, as shown in FIG. 9A. The source application name is the name of slot application for the data source.

Figure 10:
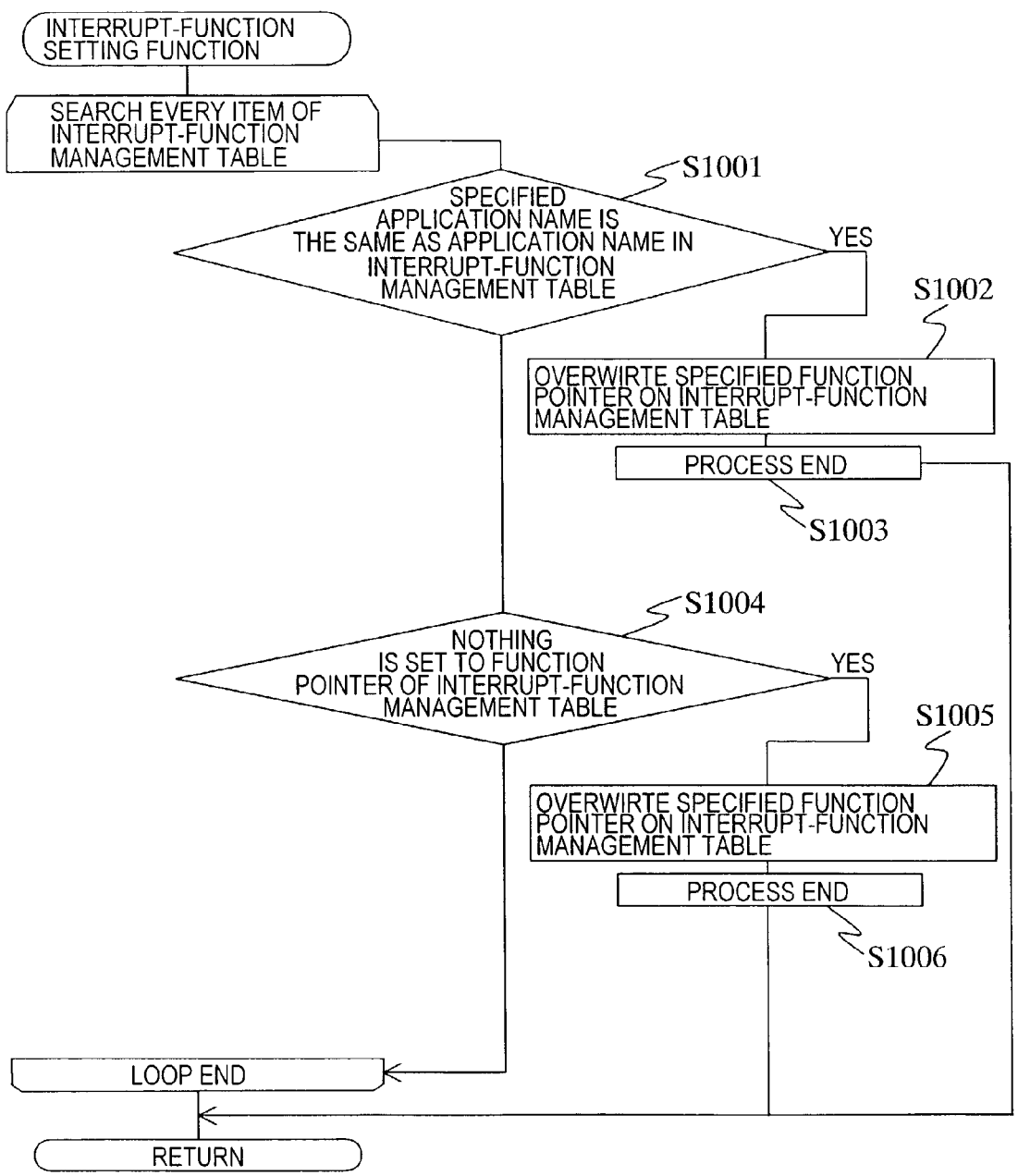
FIG. 10 is a flowchart showing the working procedure of the interrupt-function setting function.

FIG. 10 is a flowchart showing the working procedure of the interrupt-function setting function.

As shown in FIG. 10, the interrupt-function setting function searches all the items of the interrupt-function management table, and judges regarding every item whether the source application name corresponding to the attached source application name has been registered or not (S1001). If there is the item in which the source application name has been set, the interrupt-function setting function overwrites and sets the interrupt-function pointer in the item with the attached one (S1002), and then terminates the processing (S1003). On the other hand, in case of not finding out the item in which the source application name has been set, the interrupt-function setting function judges whether there is any unoccupied item in which the interrupt-function pointer is not set (S1004). When it is determined that there is the unoccupied item, the interrupt-function setting function sets the attached source application name and the interrupt-function pointer to the unoccupied item (S1005), and then terminates the processing (S1006). For instance, as shown in FIG. 9B, in the interrupt-function management table, the source application name "remocon" representing the simulated device 20 is correlated with the interrupt-function pointer "receive_remocon". The interrupt-function indicated by the interrupt-function pointer receives the data such as a channel number included in the transmittal data, for example.

After the inter-program communication receive task 101 of the simulated microcomputer 10 is in the state of waiting for the receipt of the data, the simulated device application task 200 that is a main task of the simulated device 20 starts up. The started simulated device application task 200 calls the inter-program communication task starter function from the simulated slot API 202 with a specific slot application name attached, as indicated by the solid thick arrow Y5 in FIG. 3. Since the simulated slot API 202 is the same as the simulated slot API 102, the steps executed by the inter-program communication task starter function are the same as those explained in FIG. 5. That is to say, first of all, the inter-program communication task starter function initializes the interrupt-function management table (S501). Next, the inter-program communication task starter function prepares the inter-program communication receive task 201, as indicated by the dashed thick arrow Y6 in FIG. 3 (S502).

Additionally, the working procedure of the inter-program communication receive task 201 is basically the same as that of the inter-program communication receive task 101 shown in FIG. 6. That is to say, the inter-program communication receive task 201 requests the inter-program communication system provided by OS to register as the server for the inter-program communication in the name of the specific slot application name, and obtains the inter-program communication handle (S601). At this time, the slot application name is a "remocon" representing the simulated device 20, for example. The inter-program communication handle obtained corresponding to the slot application name is a "handle_remocon", for example. Next, the inter-program communication receive task 201 executes the request to connect with the inter-program communication task 301 with the slot application name attached, as indicated by the solid thin arrow Y7 in FIG. 3 (S602).

In response to the connecting request from the inter-program communication receive task 201, the inter-program communication receive task 301 of the simulated bus manager judges the receive type (S404).

Since the receive type is the connection in this case, the inter-program communication receive task 301 calls the inter-program communication handle register function (S4071). At this time, the argument of the inter-program communication handle register function contains the slot application name "remocon" attached to the connecting request. According to the inter-program communication handle register function, likewise the inter-program communication receive task 101, the slot application name and the inter-program communication handle are set to the inter-program communication handle management table. The inter-program communication handle management table is configured as shown in FIG. 8C, for example. As shown in FIG. 8C, "remocon" representing the simulated device 20 is set as the slot application name in addition to "micon" representing the simulated microcomputer 10, while this slot application name "remocon" is correlated with the inter-program communication handle "handle_remocon".

As described above, the inter-program communication receive task 201 is connected with the inter-program communication receive task 301, and meanwhile the inter-program communication receive task 201 of the simulated device 20 comes into a state of waiting for receiving the data from the inter-program communication system. Under the state of waiting, where the inter-program communication receive task 201 accepts the interrupt from the other program (the simulated microcomputer 10, in this case), the interrupt-function setting function is called in the same way as the inter-program communication receive task 101. The interrupt-function setting function sets the source application name and the interrupt-function pointer of the interrupt-function 200i to the interrupt-function management table, however, this interrupt-function management table should be separated from the inter-program communication receive task 101. On the interrupt-function management table, as shown in FIG. 9C, the interrupt-function pointer "receive_micron" is correlated with the source application name "micon" representing the simulated microcomputer 10, for example.

The inter-program receive task 201 of the simulated device 20 is also connected with the inter-program receive task 301 of the simulated bus manager as above, the startup of the simulated microcomputer board A1 is completed and it comes to the state that the communication can be executed between respective programs through the simulated bus 3D. Besides, the inter-program communication transfer task 303 is not prepared at this time. The step to prepare the inter-program transfer task 303 is executed only when the inter-program communication receive task 301 receives the request to send data or the data itself from the simulated microcomputer 10 or the simulated device 20 and said receive type is the data receive under the state of waiting for receiving the data.

Figure 11:
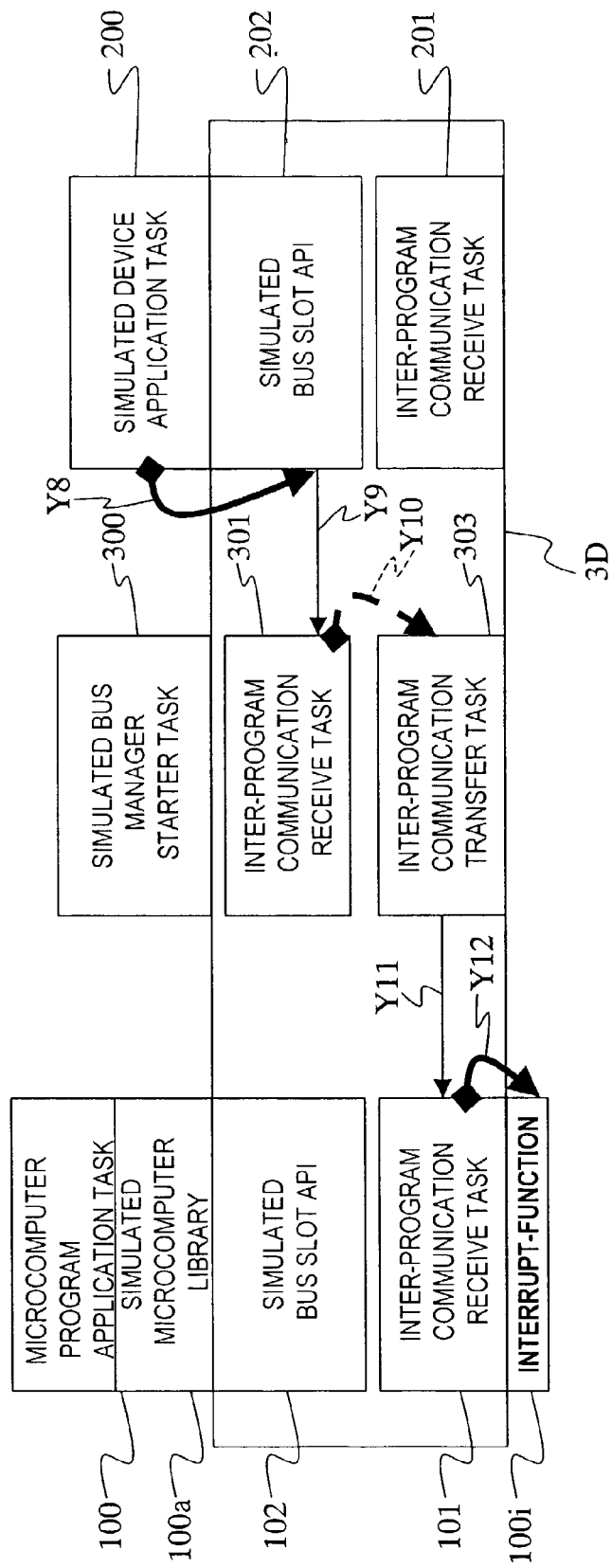
FIG. 11 is a diagram explaining the asynchronous communication of the simulated microcomputer board in the embodiment 1.

The following explains about a case where the simulated microcomputer 10 takes the opportunity of outputting the data from the simulated device 20 and receives the data. In this case, the data communication is carried out by the asynchronous data transmission. And, as shown in FIG. 11, the interrupt-function 100i may be set to the side of the simulated microcomputer 10. But it is not necessary to set the interrupt-function 200i to the side of the simulated device.

First of all, the simulated device application task 200 of the simulated device 20 calls the inter-program transmittal function from the simulated bus slot API 202 with the transmittal data attached, as indicated by the solid thick arrow Y8 in FIG. 11. The transmittal data comprises a source application name, a destination application name, a communication type, and data. The source application name is "remocon" representing the simulated device, the destination application name is "micon" representing the simulated microcomputer, the communication type is the asynchronous, and the data is the channel number of the remote controller 2a, for example.

Figure 12:
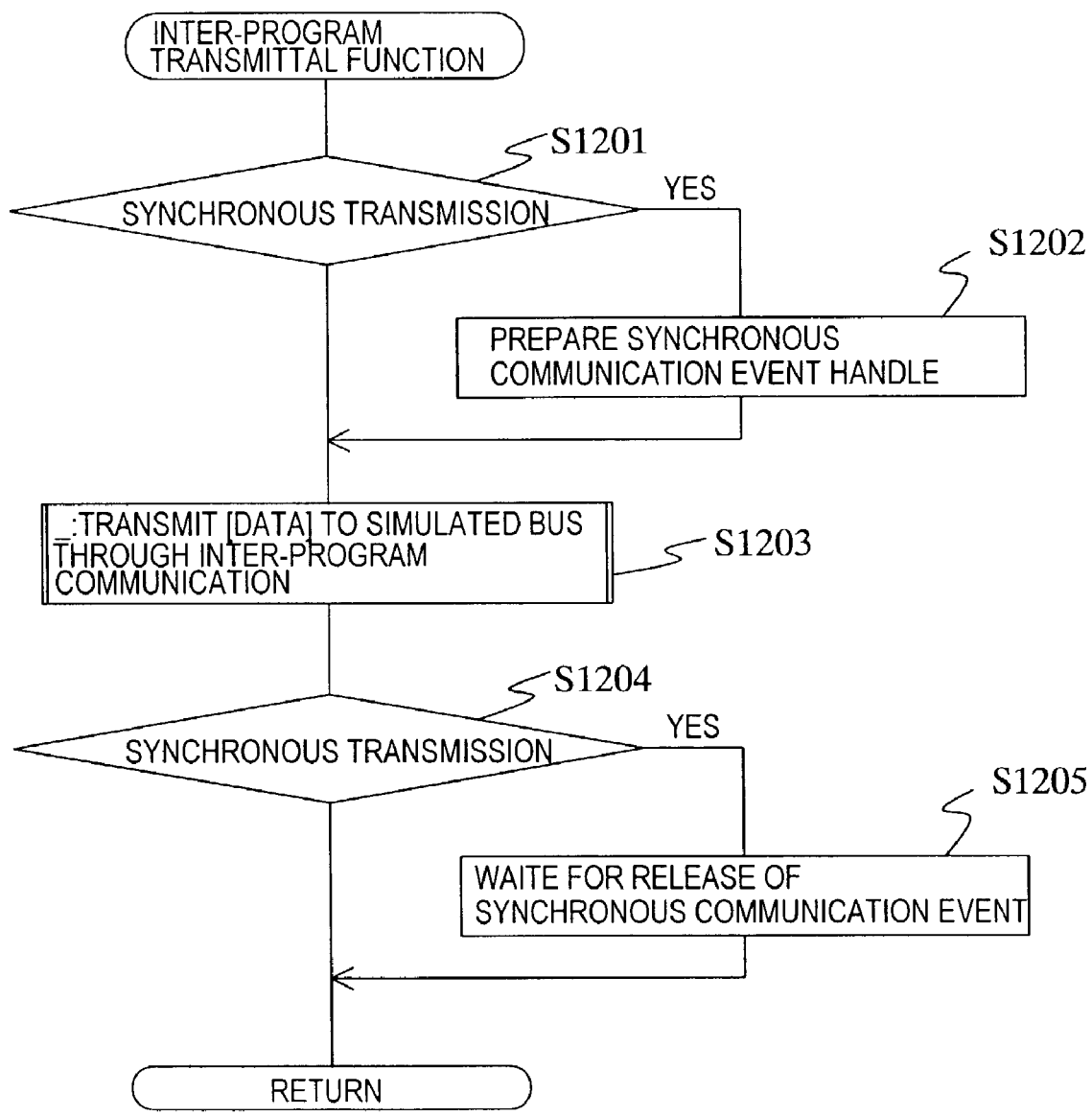
FIG. 12 is a flowchart showing the working procedure of the inter-program transmittal function.

FIG. 12 is a flowchart showing the working procedure of the inter-program transmittal function.

As shown in FIG. 12, the inter-program transmittal function judges whether the communication is synchronous or asynchronous (S1201), if the asynchronous, issues the request to send data to the inter-program communication system of OS, and then transmits the transmittal data to the inter-program communication receive task 301 of the simulated bus manager, as indicated by the soil thin arrow Y9 in FIG. 11 (S1203).

In this case, the receive type is the data receive, thereby the inter-program communication receive task 301 prepares the inter-program communication transfer task 303, as indicated by the dashed thick arrow Y10 in FIG. 11 (S4061). At this time, the transmittal data is given to the inter-program communication transfer task 303.

Figure 13:
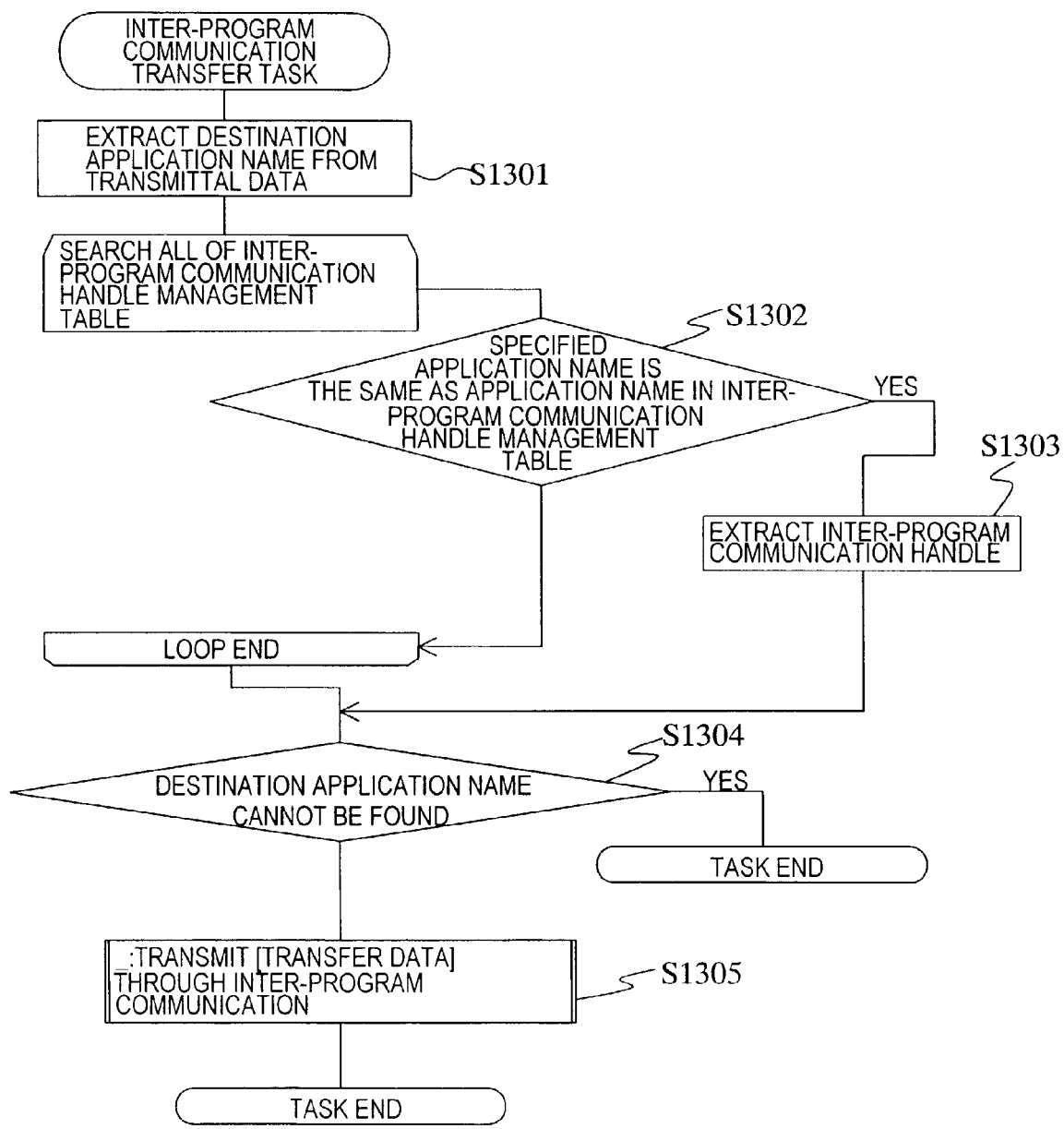
FIG. 13 is a flowchart showing the working procedure of the inter-program communication transfer task.

FIG. 13 is a flowchart showing the working procedure of the inter-program communication transfer task.

As shown in FIG. 13, first of all, the inter-program communication transfer task 303 extracts the destination application name from the transmittal data (S1301). Next, the inter-program communication transfer task 303 searches a slot application name corresponding to the extracted destination application name from the inter-program communication handle management table (S1302). If the slot application name can be found, the inter-program communication handle correlated with the slot application name is extracted (S1303). In this case, since the destination application name is "micon", the inter-program communication handle to be extracted is "handle_micon" as shown in FIG. 8C. If the destination application name can be searched (S1304), the inter-program communication transfer task 303 issues the request to send data to the inter-program communication system by means of the extracted inter-program communication handle, and then transmits the transmittal data to the inter-program communication receive task 101 of the simulated microcomputer 10, as indicated by the solid thin arrow Y11 in FIG. 11 (S1305).

In this case, since the receive type is the data receive, the inter-program communication receive task 101 of the simulated microcomputer 10 calls the interrupt-function call process function (S606). The argument of the interrupt-function call process function includes the received transmittal data.

Figure 14:
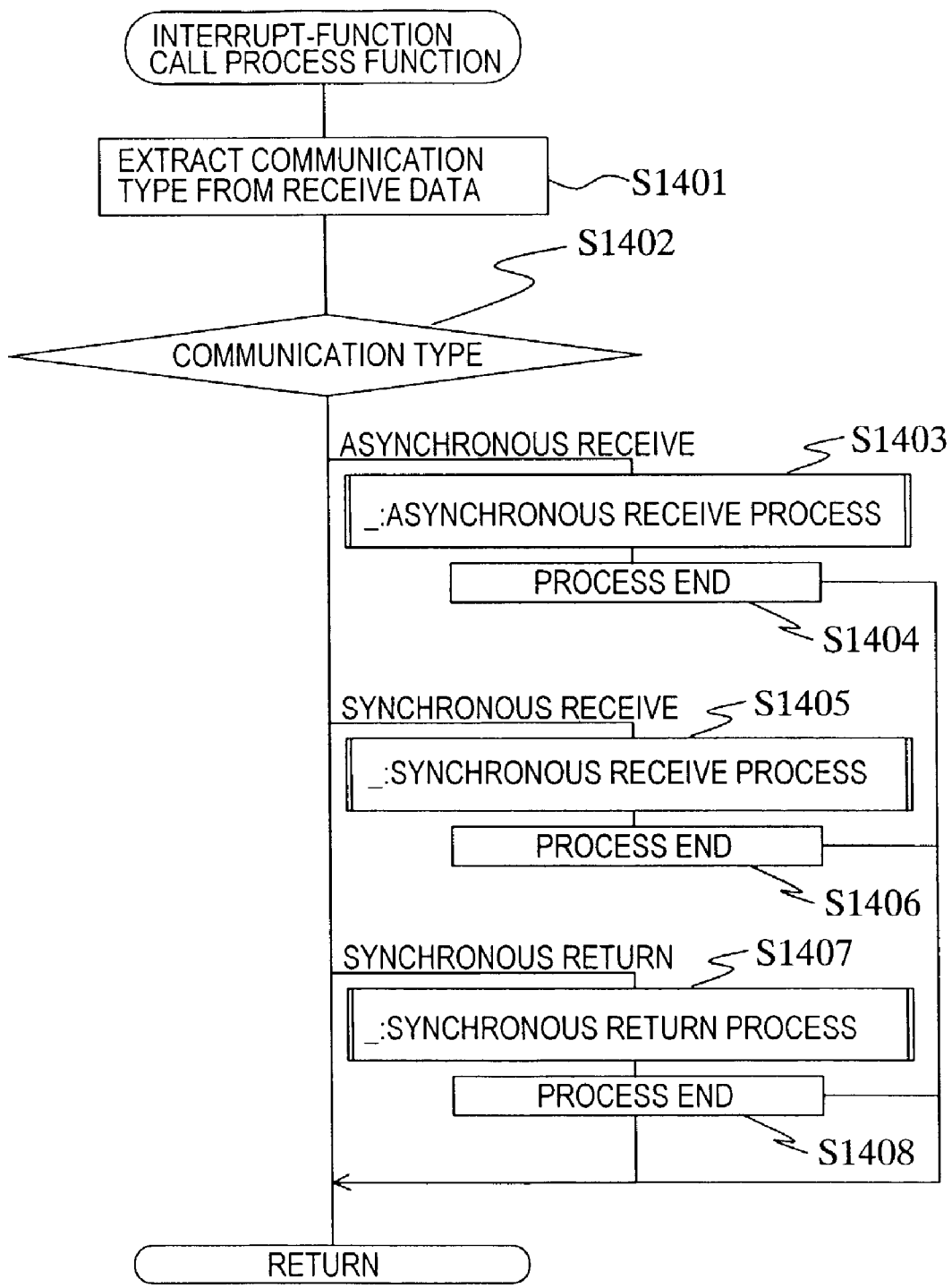
FIG. 14 is a flowchart showing the working procedure of the interrupt-function call process function.

FIG. 14 is a flowchart showing the working procedure of the interrupt-function call process function.

As shown in FIG. 14, the interrupt-function call process function extracts the communication type from the transmittal data first (S1401). Next, the interrupt-function call process function judges whether the communication type is either the asynchronous receive, the synchronous receive, or the synchronous return (S1402). In this case, since the communication type is the asynchronous receive, the interrupt-function calls the asynchronous receive process function (S1403). The transmittal data is given to the asynchronous receive process function.

Figure 15:
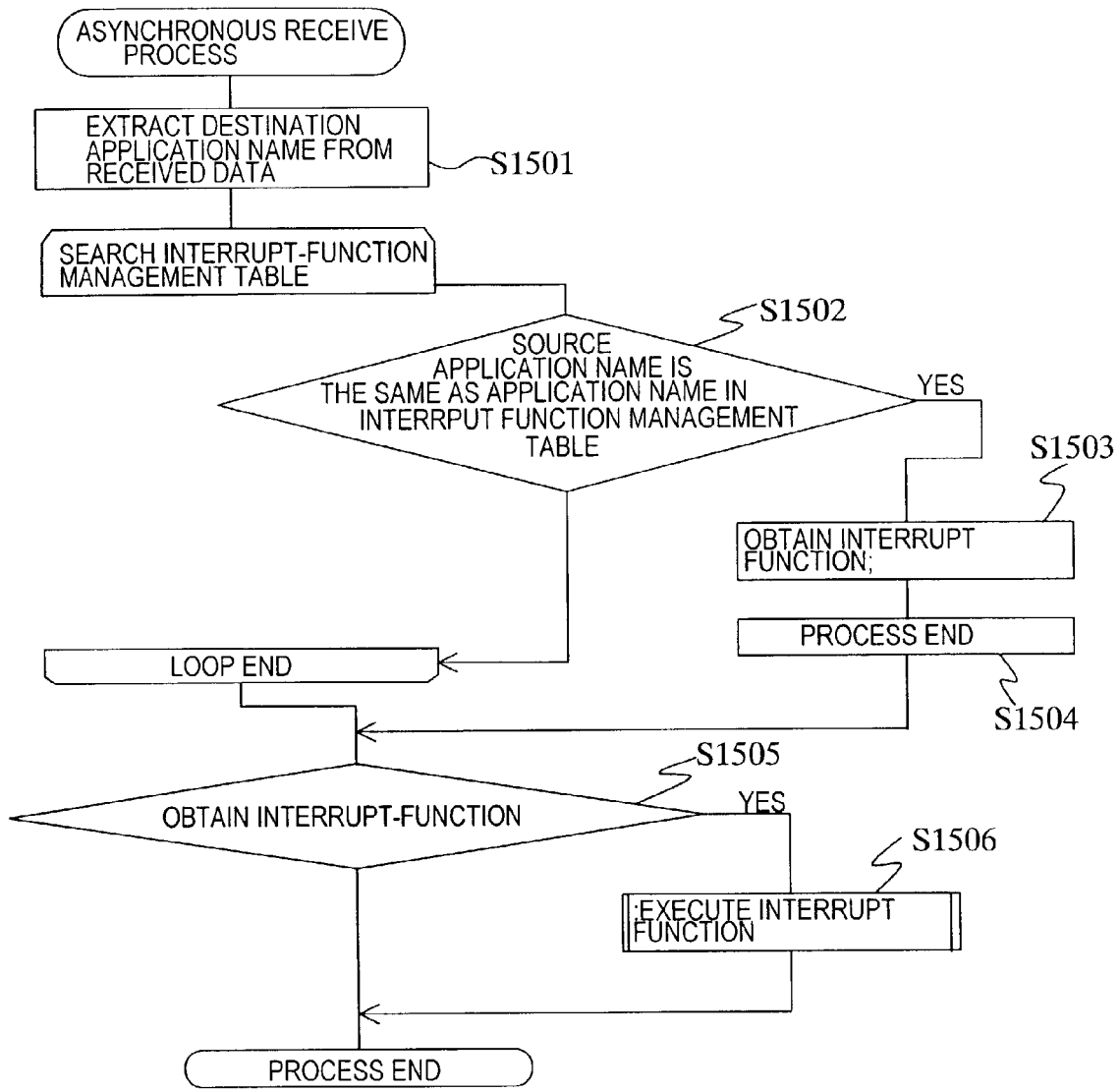
FIG. 15 is a flowchart showing the working procedure of the asynchronous receive process function.

FIG. 15 is a flowchart showing the working procedure of the asynchronous receive process function.

As shown in FIG. 15, first of all, the asynchronous receive process function extracts the source application name from the transmittal data (S1501). Next, a source application name corresponding to the extracted source application name is searched from the interrupt-function management table (S1502). If the corresponding source application name can be found, the asynchronous receive process function extracts the interrupt-function pointer of the item corresponding to the source application name, and then obtains the interrupt-function indicated by the interrupt-function pointer (S1503), thereby the searching is terminated (S1504). In this case, since the source application name to be extracted from the transmittal data is "remocon", the interrupt-function pointer extracted from the interrupt-function management table shown in FIG. 9B is "receive_remocon( )". And the asynchronous receive process function, if the interrupt-function can be obtained (S1505), calls the interrupt-function and executes this (S1506), as indicated by the solid thick arrow Y12 in FIG. 11. Therefore, the data from the simulated device 20 is received by the simulated microcomputer 10.

Figure 16:
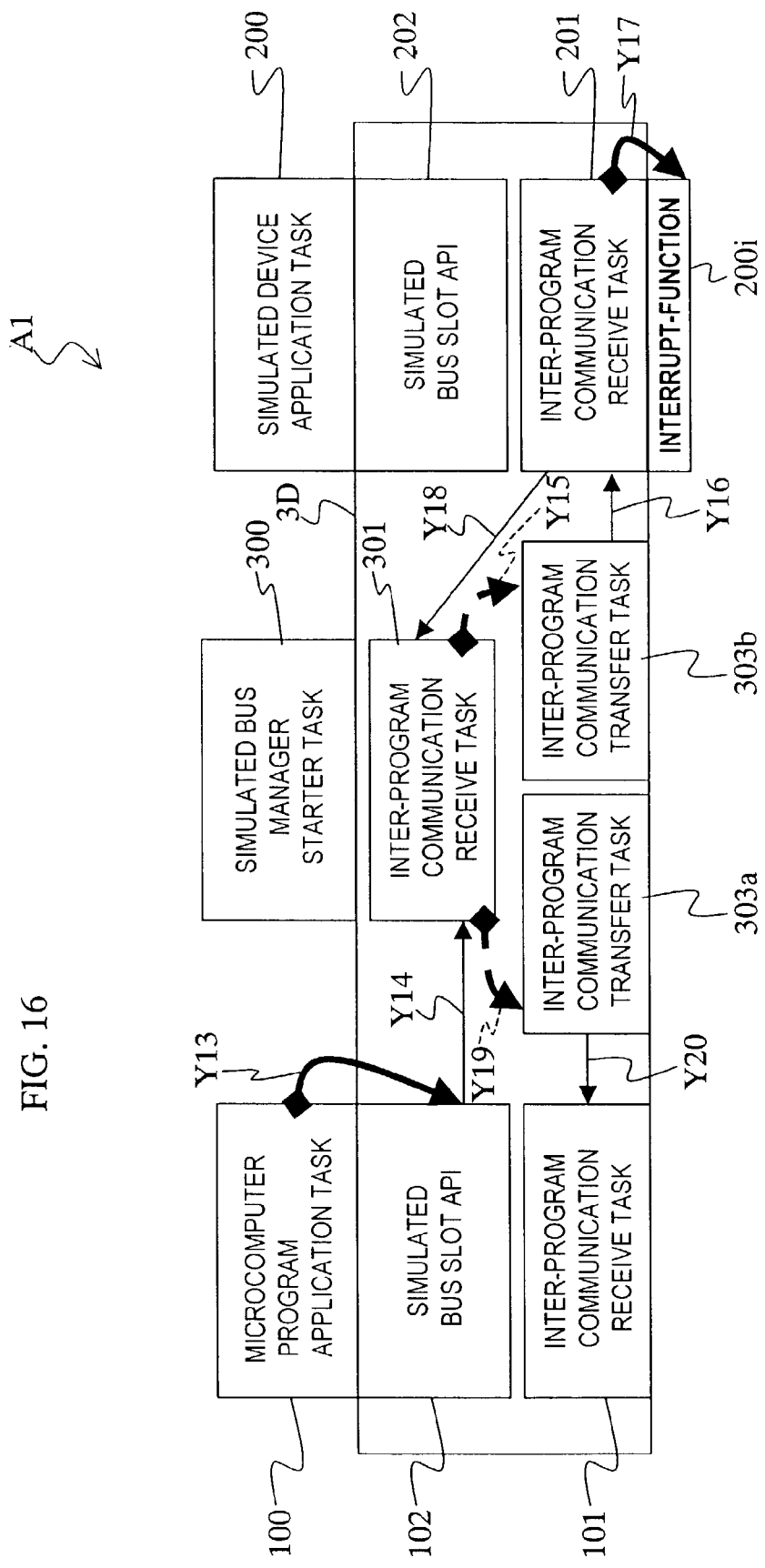
FIG. 16 is a diagram explaining the synchronous communication of the simulated microcomputer in the embodiment 1.

Next, in response to the request to send data from the simulated microcomputer 10, the simulated device 20 outputs the data, and the simulated microcomputer 10 receives the data, and this procedure is explained hereinafter. In this case, the data transmission is carried out by the synchronous data transmission. And the interrupt-function 200*i* may be set to the side of the simulated device 20 as shown in FIG. 16, but it is not necessary to set the interrupt-function 100*i* to the side of the simulated microcomputer 10. Additionally, the simulated bus manager applies two of inter-program communication transfer tasks 303*a* and 303*b*.

As indicated by the solid thick arrow Y13 in FIG. 16, first of all, the microcomputer program application task 100 of the simulated microcomputer 10 calls the inter-program transmittal function with the transmittal data attached. The transmittal data comprises the source application name, the destination application name, the communication type, and the return data information. For instance, the source application name is "micon" representing the simulated microcomputer 10, the destination application name is "remocon" representing the simulated device 20, and the communication type is the "synchronous". The return data information is a code string representing the return data size and the return data memory.

In this case, since the communication is the synchronous type, the inter-program transmittal function prepares the synchronous communication event handle (S1202) as shown in FIG. 12. In addition, the request to send data is issued to the inter-program communication system and then the transmittal data is transmitted to the inter-program communication receive task 301 of the simulated bus manager, as indicated by the solid thin arrow Y14 in FIG. 16 (S1203). Since the communication is the synchronous (S1204), the microcomputer program application task 100 of the simulated microcomputer 10 is made to be the state of waiting for the synchronous communication event (S1205).

In this case, since the receive type is the data receive, the inter-program communication receive task 301 of the simulated bus manager prepares the inter-program communication transfer task 303*b* as indicated by the dashed thick arrow Y15 in FIG. 16 (S4061), terminates the processing (S4062), and then returns the state of waiting for the data receiving. The inter-program communication transfer task 303b is for transmitting the transmittal data to the simulated device 20.

The inter-program communication transfer task 303*b* executes the steps from S1301 to S1305 shown in FIG. 13. Since the destination application name is "remocon" representing the simulated device 20 in this case, the inter-program communication handle "handle_remocon" is to be extracted from the inter-program communication handle management table shown in FIG. 8C. The inter-program communication transfer task 303*b* issues the request to send data to the inter-program communication system by means of the inter-program communication handle, and then transmits the transmittal data to the inter-program communication receive task 201 of the simulated device 20, as indicated by the solid thin arrow Y16 in FIG. 16.

At receiving the transmittal data from the inter-program communication transfer task 303*b*, because the receive type is the data receiving, the inter-program communication receive task 201 calls the interrupt-function call process function (S606). The interrupt-function call process function executes the steps S1401 and S1402. In this case, since the communication type is the synchronous receive, the interrupt-function call process function calls the synchronous receive process function (S1405) and then terminates the processing (S1406).

Figure 17:
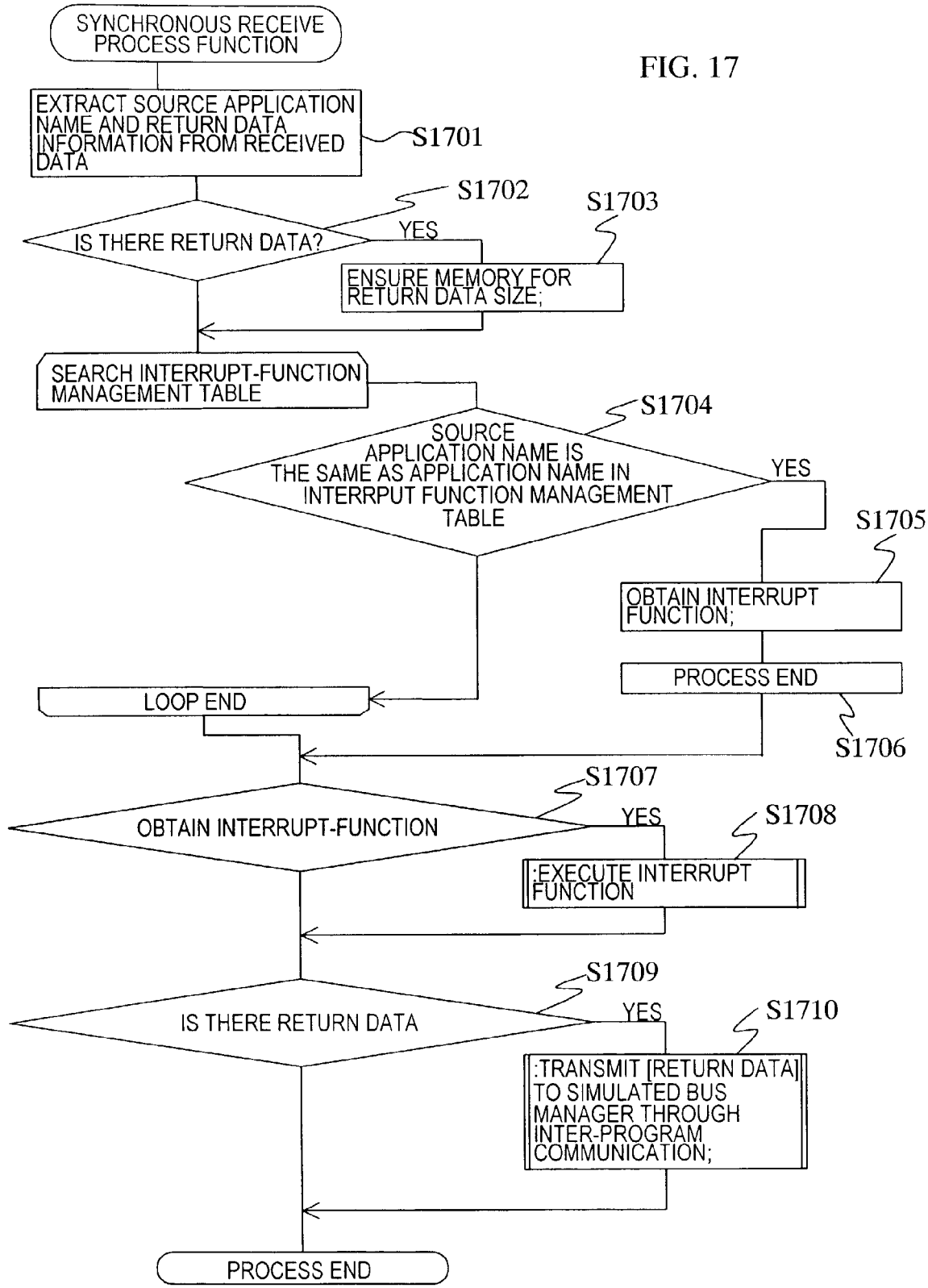
FIG. 17 is a flowchart of the working procedure of the synchronous receive process function.

FIG. 17 is a flowchart showing the working procedure of the synchronous receive process function.

As shown in FIG. 17, the synchronous receive process function extracts the return data information and the source application name from the transmittal data (S1701). Next, the synchronous receive process function judges whether a request to send return data is received or not (S1702). If there is the request to send return data, the memory is assured for the return data size (S1703). And then, the synchronous receive process function searches from the interrupt-function management table the source application name corresponding to the source application name extracted from the transmittal data (S1704). If the corresponding source application name is found, the synchronous receive process function extracts the interrupt-function pointer of the item corresponding to the source application name and obtains the interrupt-function indicated by the interrupt-function pointer (S1705), and then terminates the processing (S1706). In this case, because the source application name extracted from the transmittal data is "micon", the interrupt-function pointer to be extracted from the interrupt-function management table in FIG. 9C is "receiv_micon( )". The synchronous receive process function, if the interrupt-function has been obtained (S1707), calls this as indicated by the solid thick arrow Y17 in FIG. 16, and then executes the interrupt-function (S1708). After the execution of the interrupt-function, if there is any return data (S1709), the synchronous receive process function issues the request to send data to the inter-program communication system, and then transmits the return data to the inter-program communication receive task 301 of the simulated bus manager (S1710). The return data comprises the source application name, the destination application name, the communication type and the data. For example, the source application name is "remocon" representing the simulated device 20, the destination application name is "micon" representing the microcomputer 10, and the communication type is the "synchronous". The data is the one to be sent back in response to the request to send data of the simulated microcomputer.

When the inter-program communication receive task 301 of the simulated bus manager receives the return data, the receive type is the data receive, the inter-program receive task 301 prepares the inter-program communication transfer task 303a as indicated by the dashed thick arrow Y19 in FIG. 16 (S4061), terminates the processing (S4062), and then returns to the state of waiting for the data receiving. The inter-program communication transfer task 303a is for transmitting the return data to the simulated microcomputer 10.

The inter-program communication transfer task 303a executes the steps from S1301 to S1305 shown in FIG. 13. In this case, since the destination application name is "micon" representing the simulated microcomputer 10, the inter-program communication handle "handle_micon" is to be extracted from the inter-program communication handle management table shown in FIG. 8C. The inter-program communication transfer task 303a issues a request to send data to the inter-program communication system by means of the extracted inter-program communication handle, and then transmits the return data to the inter-program communication receive task 101 of the simulated microcomputer 10 as indicated by the solid thin arrow 20 in FIG. 16.

When the return data is received by the inter-program communication receive task 101 of the simulated microcomputer 10, because the receive type is the data receive, the inter-program communication receive task 101 calls the interrupt-function call process function (S606). The interrupt-function call process function executes the steps S1401 and S1402. In this case, since the communication type is the synchronous return, the interrupt-function call process function calls the synchronous return process function (S1407), and then terminates the processing (S1408).

Figure 18:
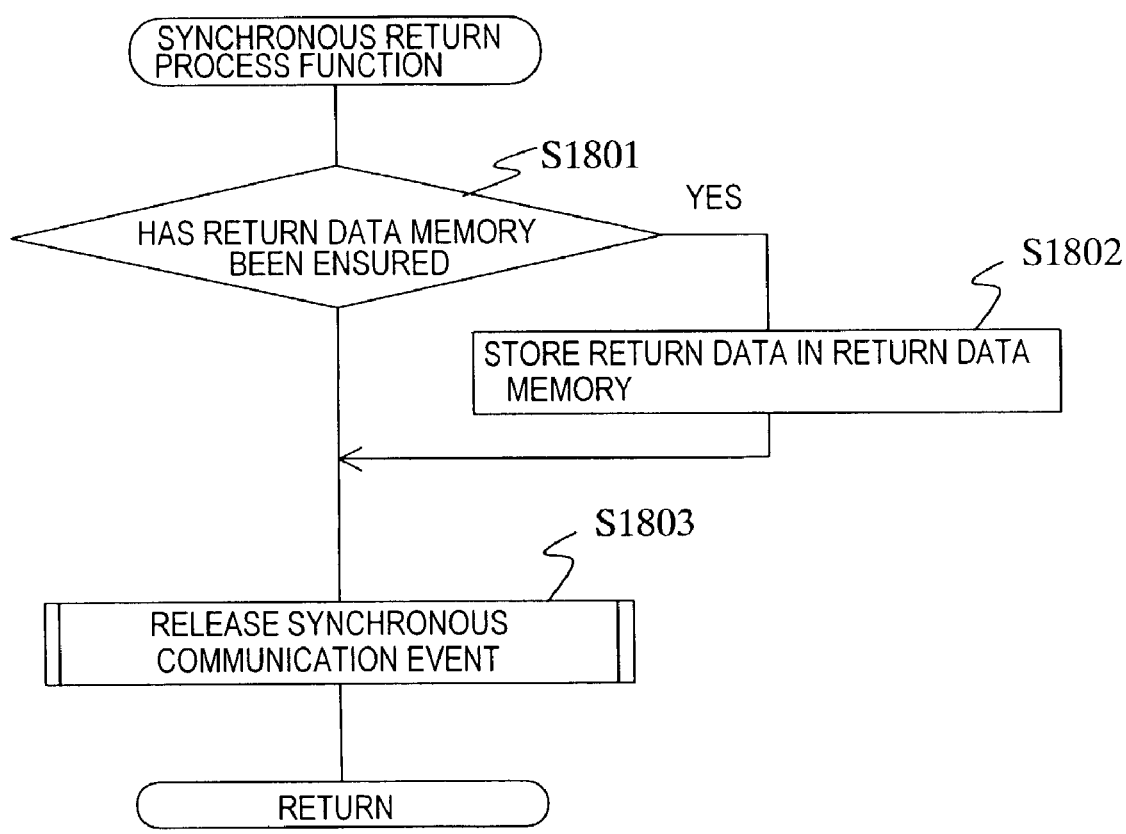
FIG. 18 is a flowchart showing the working process of the synchronous return process function.
Figure 20:
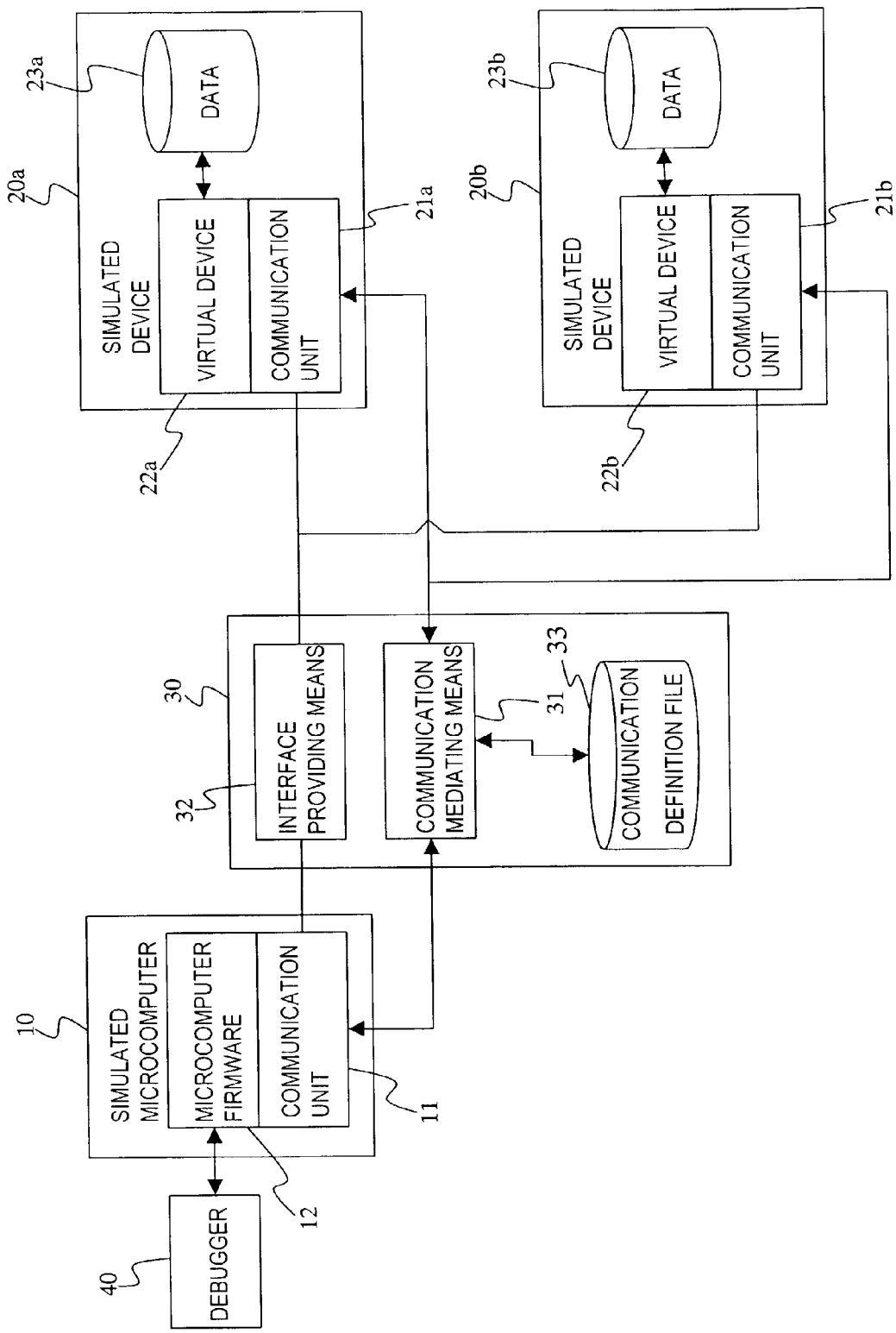
FIG. 20 is a schematic block diagram of the bus simulation apparatus in the embodiment 3.

FIG. 18 is a flowchart showing the working procedures of the synchronous return process.

As shown in FIG. 18, the synchronous return process function judges whether the return data memory is assured or not (S1801). If the return data memory is assured, the synchronous receive process function stores the return data in the return data memory (S1802). And the synchronous receive process function releases the synchronous communication event, and then re-executes the microcomputer program application task 100.

As described above, the simulated microcomputer board Al permits the simulated microcomputer 10 to receive the data also through the synchronous communication.

Even in either case of the synchronous communication or the asynchronous communication, it is possible to centralize the communication between the simulated microcomputer 10 and the simulated device 20 by utilizing the common interface provided by the simulated bus slot API 102 and 202. In result, it improves the preparation efficiency, the portability and the reusability, and in addition to this, it is possible to promote the operating performance for the testing and the debugging of the microcomputer board. The simulated microcomputer 10 and the simulated device 20 may use nothing other than the slot application name as the source or the destination of the data. The communication between the simulated microcomputer 10 and the simulated device 20 is mediated by the simulated device manager. The simulated bus manager equates the simulated microcomputer with the simulated device. Accordingly, it is possible to avoid the influences caused by the startup order that occurs where the relation between the server and the client appears between the simulated microcomputer and the simulated device.

Embodiment 2

There is a description in the first embodiment that the simulated device 20 executes the interrupt-function in case of the synchronous communication, for example. Instead of the interrupt-function, a function provided with a specific faculty can be published to the outside of the simulated device 20. The pointer for this function (the function is called a export-function, hereafter) is managed by the inter-rupt-function management table like the interrupt-function. A concrete example of the interrupt-function management table managed by the simulated device 20 is shown in FIG. 19. In the interrupt-function management table shown in FIG. 19, the pointer of the export-function "function2( )" is also registered in addition to the pointer "receive_micon( )" of the interrupt-function corresponding to the source application name "micon". The export-function is correlated with the name of the export-function. What the pointer "function2( )" is correlated with is the name "function2" of the export-function.

The export-function of the simulated device can be utilized according to about the same steps as in the synchronous communication of the embodiment 1, for example. At the time of the request to send data to the simulated device 20, the request end may attach as the sending data the name of export-function to be used, such as "function2" in this case, to this request.

The simulated device 20 extracts the export-function name from the sending data, and researches the source application name corresponding to the extracted export-function name. If the source application name is found, the export-function corresponding to the source application name is executed.

By utilizing such export-function, the other simulated device, even though not includes the function provided by the export-function, can share the same function. It is needless to say that, where there is return data, the simulated device can transmit the return data to the simulated microcomputer 10 in the same way of the synchronous communication in the embodiment 1.

Embodiment 3

As described above, in the simulated microcomputer board A1, the simulated microcomputer 10 and the simulated device 20 may simply specify the slot application name in order to represent the source and destination. Accordingly, for example in case of changing the destination, only the slot application name may be changed. However, the case where the program should be reconfigured at the changing of the slot application name is inconvenient.

Consequently, the bus simulation apparatus 30 in the embodiment 3 is provided with a communication definition file 33. The communication definition file 33 is a text file for defining the communication route, for example. The content of change and etc. should be described in the communication definition file 33. For instance, the communication mediating means 31 changes the source from the simulated device 20a to the simulated device 20b referring to the transfer management table prepared on the memory from the communication definition file 33.

Figure 21:
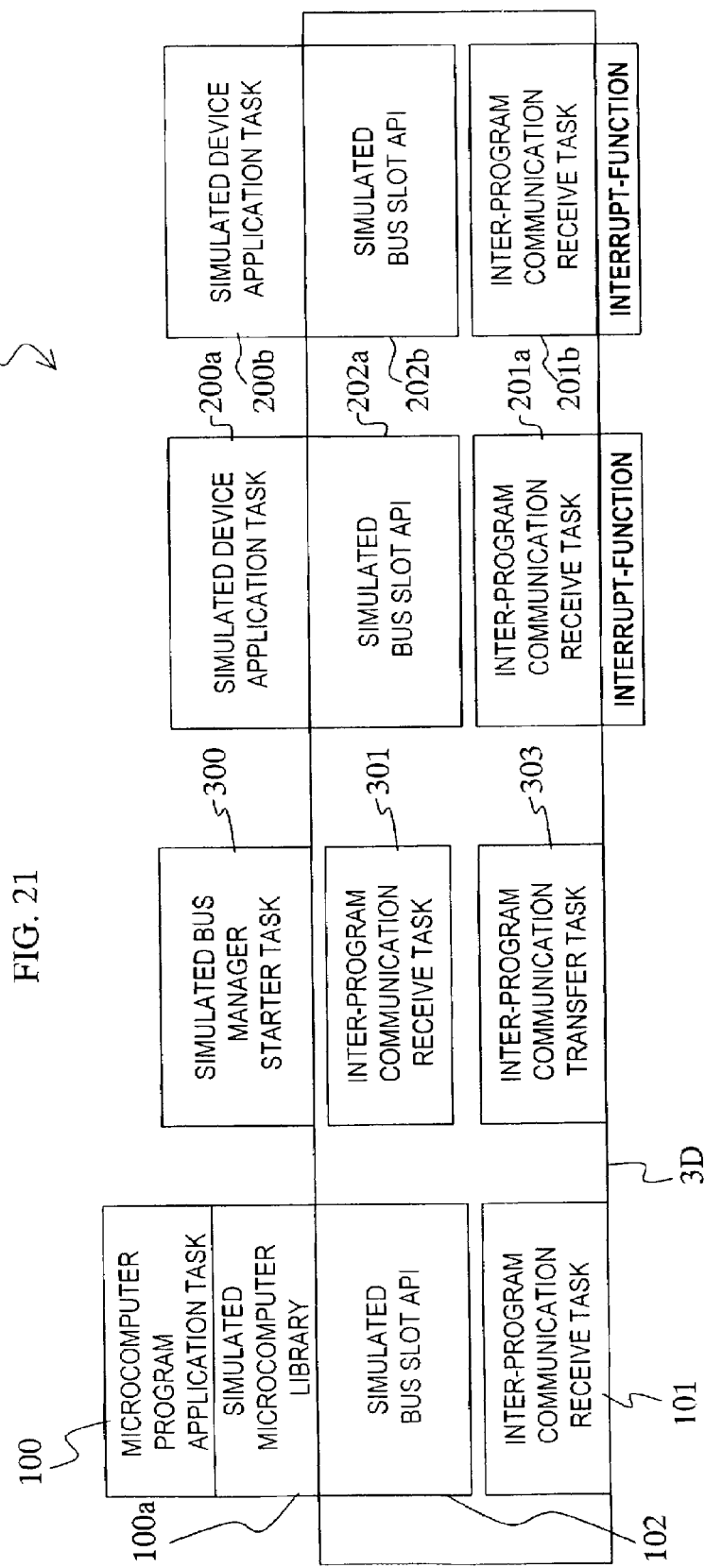
FIG. 21 is a diagram showing the configuration of the simulated microcomputer board in the embodiment 3.

Each program of the simulated bus manager, the simulated microcomputer and the simulated devices 2a and 2b, those corresponding to the communication mediating means 31, are handled as a task shown in FIG. 21, for example.

The tasks correlated with the simulated device 20a are the simulated device application task 200a and the inter-program communication receive task 201a. The tasks correlated with the simulated device 20b are the simulated device application task 200b and the inter-program communication receive task 201b. The respective tasks correlated with the simulated devices 20a and 20b are linked to the above-mentioned common library, and can use the same simulated bus slot API 201a and 201b that are separated each other.

It is assumed that the inter-program communication receive task 201a prepared by the simulated device application task 200a specifies the slot application name "remocon" and requests to make the server registration, while the simulated microcomputer 10 initially has specified the slot application name as the destination.

In addition, the inter-program communication receive task 201b prepared by the simulated device application task 200b specifies the slot application name "remocon2" and requests to make the server registration.

If the slot application name of the destination specified by the simulated microcomputer is changed from "remocon" to "remocon2", the change is described in the communication definition file 33.

FIG. 22 shows a concrete example of the transfer management table prepared from the communication definition file 33. The transfer management table represents the original communication route and the changed communication route, those communication route correlated by the communication definition file 33. In this embodiment, the transfer management table represents a original slot application name and a changed slot application name correlated with the former. The example of FIG. 22 shows that the changed slot application name "remocon2" is correlated with the original slot application name "remocon".

The inter-program communication transfer task 303 of the simulated bus manager, referring to the transfer management table, changes the destination from the inter-program communication receive task 301a to the inter-program communication receive task 301b.

The inter-program communication transfer task 303 extracts the destination application name from the sending data, for example (S1301), and then refers to the transfer management table before searching the inter-program communication handle management table. Next, the inter-program communication transfer task 303 searches from the transfer management table the slot application name corresponding to the extracted destination application name. If the corresponding slot application name is found, the inter-program communication transfer task 303 extracts from the transfer management table the changed slot application name correlated with the slot application name. And then, the extracted slot application name is made to be an object of the searching in the step S1302. Thereby, the destination is to be changed.

Changing the destination in such way can eliminate the need to reconfigure the program, and only a simple operation for editing the communication definition file is required. Thereby the invention can improve productivity furthermore, and help in the simulation for the change or the branch caused by the jumper cable of the bus wiring particularly.

Embodiment 4

In addition, by means of the communication definition file 33, it is possible not only to change the communication end but also to perform the broadcast communication in simple manner. FIG. 23 shows a concrete example of the broadcast transmittal management table prepared on the memory from the communication definition file 33 in case of the broadcast communication. The broadcast transmittal management table represents a communication route correlated with a specific communication route by the communication definition file 33. In this embodiment, the broadcast transmittal management table represents that a slot application name is correlated with the other slot application name to be in broadcast communication with the slot application name. The example of FIG. 23 indicates that the slot application name "remocon" is correlated with the slot application name "remocon2" for the broadcast communication.

The inter-program communication transfer task 303 of the simulated bus manager 30 refers to the broadcast transmittal management table, and then transmits the transmittal data not only to the inter-program communication receive task 301a but also the inter-program communication receive task 301b.

The inter-program communication transfer task 303 extracts the destination application name from the transmittal data, for example, (S1301), and refers to the broadcast transmittal management table before searching the inter-program communication handle management table. Next, the inter-program communication transfer task 303 searches from the broadcast transmittal management table the slot application name corresponding to the extracted destination application name. If the corresponding slot application name is found, the inter-program communication transfer task 303 extracts from the broadcast transmittal management table a slot application name for the broadcast communication correlated with the searched slot application name. And the slot application name extracted from the broadcast transmittal management table is made to be an object of the searching in the step of S1302 in addition to the slot application name extracted from the transmittal data. Thereby, the transmittal data can be transmitted not only to the inter-program communication receive task 201a but also to the inter-program communication receive task 201b.

Each simulated device 20a and 20b searches from the interrupt-function management table an interrupt-function corresponding to the source application name respectively, and then executes the corresponding interrupt-functions.

As described above, it is possible to perform the broadcast communication; thereby the invention helps in particular in the simulation of the multiple branches by the jumper of the bus wiring. In addition, if it is arranged that each simulated device 20a and 20b be provided with not only the interrupt-function but also the export-function, it is possible to utilize a plurality of export-function simultaneously.

Embodiment 5

Figure 24:
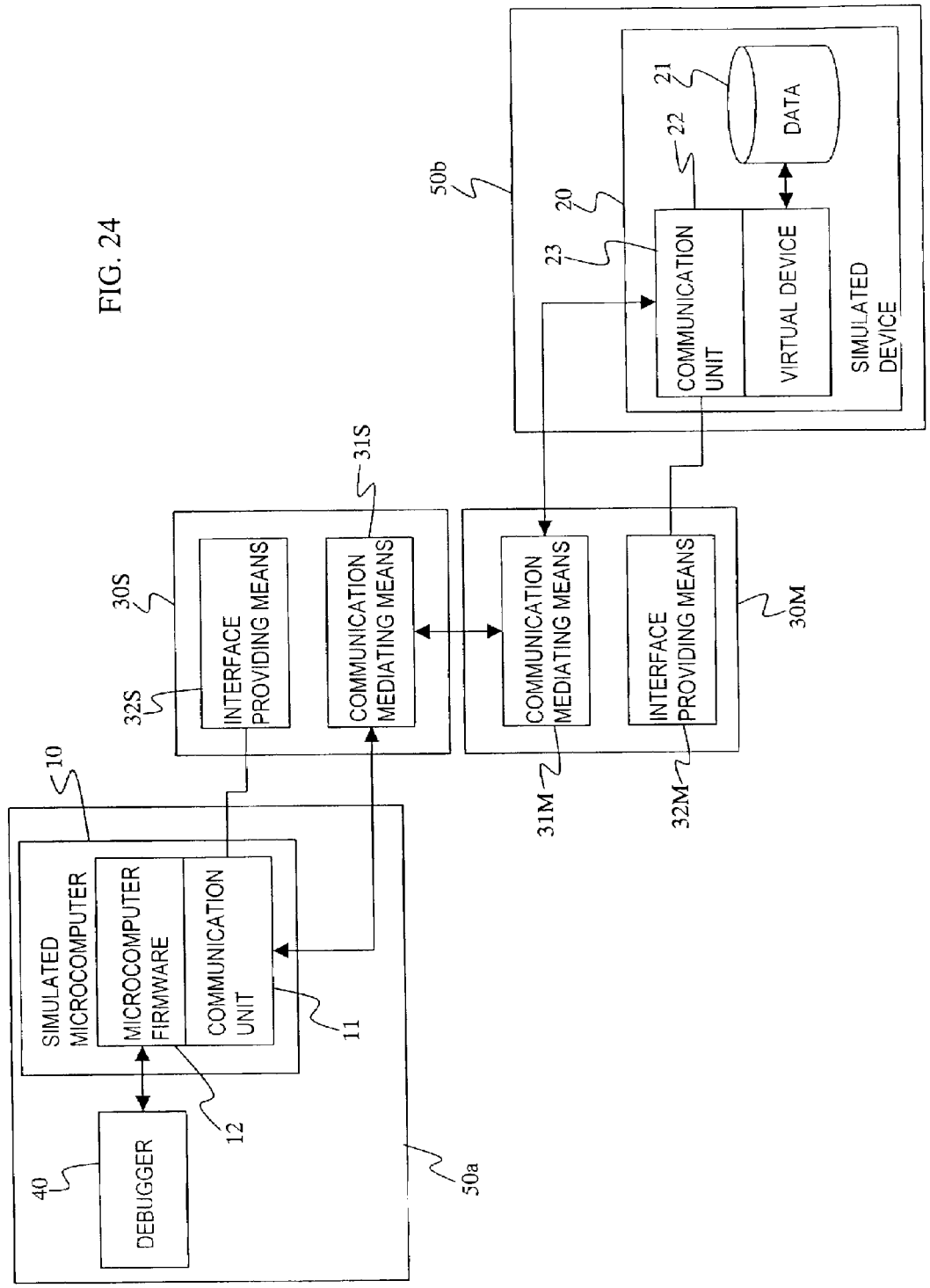
FIG. 24 is a diagram showing a schematic configuration of the bus simulation apparatus in the embodiment 5.

It is assumed in the embodiment 1 that the simulated microcomputer 10 and the simulated device 20 to be in communication with each other work on the same computer. On the contrary, as shown in FIG. 24, even if the simulated microcomputer 10 and the simulated device 20 work on the different computers 50a and 50b respectively, it is possible to simulate the bus 3 by the simulated apparatuses 30M and 30S.

In this case, the communication between the computers 50a and 50b is executed between the communication mediating means 31M of the bus simulation apparatus 30M and the communication mediating means 31S of the bus simulation apparatus 30S.

The bus simulation program for functioning the computer as the bus simulation apparatus 30S and 30M is implemented to the computer 50a and 50b respectively. Respective common libraries including the function of interface providing means 32M and 32S become separate files existing on each computer 50a and 50b, and these files are the same.

Figure 25:
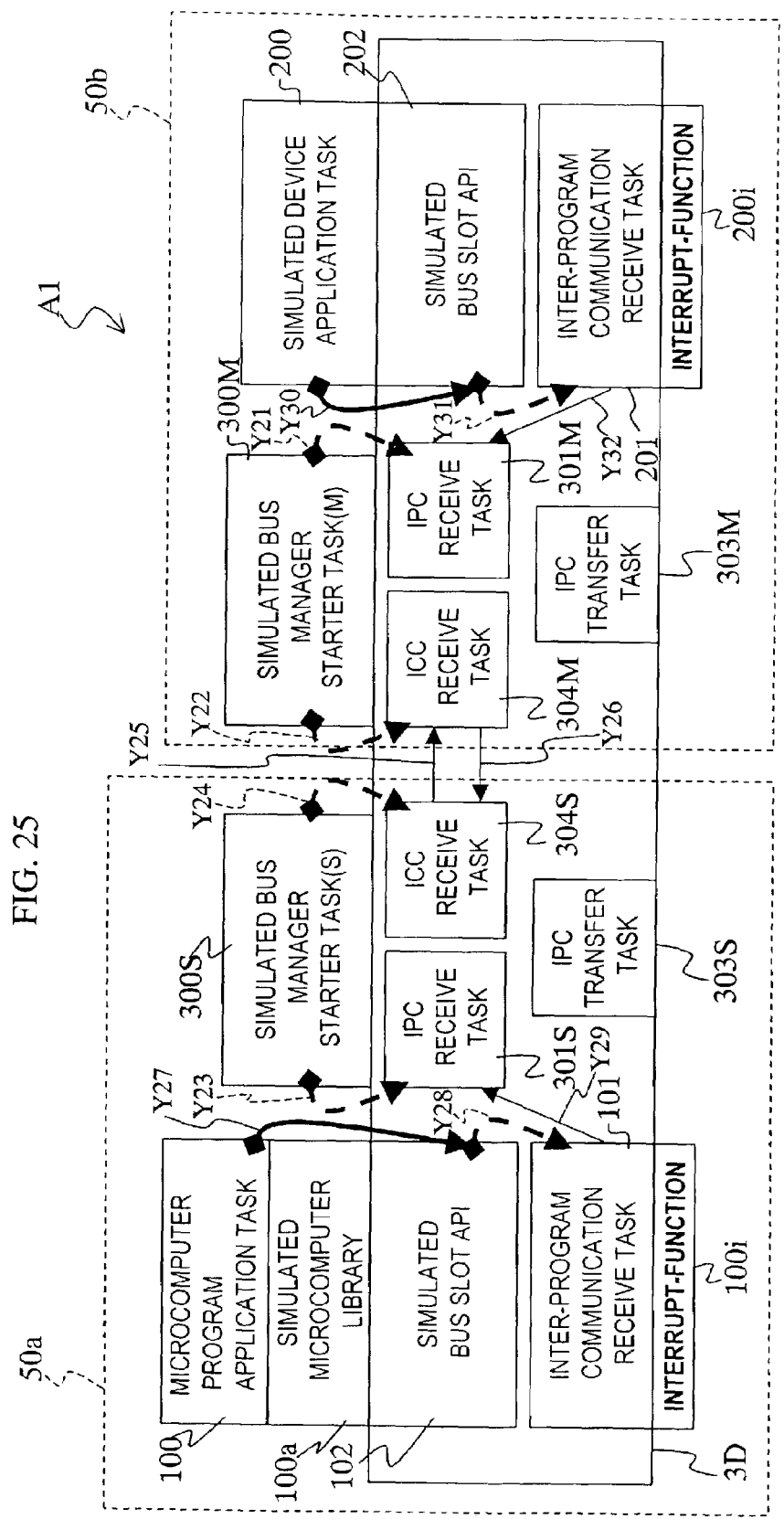
FIG. 25 is a diagram showing the configuration of the simulated microcomputer board in the embodiment 5.

As shown in FIG. 25, for example, the simulated bus manager and the simulated microcomputer 10 corresponding to the communication mediating means 31S are handled respectively as several tasks by OS of the computer 50a. Additionally, the simulated bus manager and the simulated device 20 corresponding to the communication mediating means 31M are handled respectively as several tasks by OS of the computer 50b.

The tasks correlated with the simulated bus manager are executed by both the computer 50a and 50b, however, the one starting first becomes a master and the other becomes a slave. For the communication between the task on the master side and the task on the slave side, the socket communication may be used, for example.

The simulated bus manager starter task 300M that starts first prepares the inter-program communication receive task 301M as indicated by the dashed thick arrow Y21 in FIG. 25. The inter-program communication receive task 301M executes the steps from S401 to S403. At this time, the inter-program communication handle management table is initialized, however, the structure of the inter-program communication handle management table is different partially from that in the embodiment 1. As shown in FIG. 26, the inter-program communication handle management table correlates computer names in addition to the slot application names and the inter-program communication handles.

When the inter-program communication receive task 301M becomes the state of waiting for the data receiving, in the next step the simulated bus manager starter task 300M prepares the inter-computer communication receive task 304M as indicated by the dashed thick arrow Y22 in FIG. 25.

The inter-computer communication receive task 304M initializes the inter-computer communication handle management table. Here, the inter-computer communication handle management table is for correlating the computer name with the inter-computer communication handle as shown in FIG. 27. The inter-computer communication receive task 304M asks OS about an IP address of the computer 50b and the computer name, and then obtains them. Next, the server registration for the socket communication is requested to the socket communication system. In addition, the server registration for the mail communication is requested in a specific group name to the mail communication system provided by OS.

In the next step, the simulated bus manager starter task 300S starts up. The simulated bus manager starter task 300S prepares the inter-program communication receive task 301S as indicated by the dashed thick arrow Y23 in FIG. 25,. The inter-program communication receive task 301S executes the steps from S401 to S403.

When the inter-program communication receive task 301S becomes the state of waiting for the data receiving, the simulated bus manager starter task 300S prepares the inter-computer communication receive task 304S in the next place, as shown in the dashed thick arrow Y24 in FIG. 25.

The inter-computer communication receive task 304S initializes the inter-computer communication handle management table. In addition, the inter-computer communication receive task 304S asks OS about the IP address of the computer 50a and the computer name, and then obtains them. Next, it specifies the group name and requests the mail communication system provided by OS to search the mail communication server. Further, the server registration for the socket communication is requested to the socket communication system provided by OS. The connecting request attached with the IP address and the computer name of the computer 50a is issued to the searched mail communication server through the mail communication, as indicated by the solid thin arrow Y25 in FIG. 25. For instance, the computer name is "Panal" representing the computer 50a.

When the connecting request is received by the simulated bus manager on the master side through the mail communication, the IP address and computer name of the request side, those attached to the connecting request, are extracted. Next, the connection is executed according to the extracted IP address and computer name through the socket communication. The relation between the extracted computer name and the inter-computer socket communication handle is registered in the inter-computer communication handle management table on the master side. The content of the inter-computer communication handle management table in this case shows that the computer name "Panal" representing the computer 50a is correlated with the inter-computer communication handle "hPan1", as shown in FIG. 28A. And on the basis of the inter-computer communication handle, the connecting request attached with the IP address and the computer name of the computer 50b is issued to the socket communication server of the request side through the socket communication, as indicated by the solid thin arrow Y26 in FIG. 25.

The simulated bus manager on the slave side, at receiving the connecting request from the simulated bus manager on the master side, extracts the attached IP address and computer name. Next the connection is executed by the socket communication according to the extracted IP address and computer name. Further, the relation between the extracted computer name and the inter-computer socket communication handle is registered in the inter-computer communication handle management table on the slave side. The contents of the inter-computer communication handle management table in this case shows that the computer name "PanaMaster" representing the computer 50b is correlated with the inter-computer communication handle "hPanaMaster", as shown in FIG. 28B Next, the microcomputer program application task 100 starts up, for example. The microcomputer program application task 100 calls the inter-program communication task starter function as indicated by the solid thick arrow Y27 in FIG. 25. The inter-program communication task starter function prepares the inter-program communication receive task 101 as indicated by the dashed thick arrow Y28 in FIG. 25. The inter-program communication receive task 101 executes the steps from S601 to S604. However, what the inter-program communication receive task 101 requests to connect with is the inter-program communication receive task 301S, as indicated by the solid thin arrow Y29 in FIG. 25.

At this time, since the receive type is the connection, the inter-program communication receive task 301S executes the steps S4071 and S4072. In result, the content of the inter-program communication handle management table on the slave side gets to be that shown in FIG. 30A, for example. That is to say, in the inter-program communication handle management table, the slot application name representing "micon" is correlated with the inter-program communication handle "handle_micon".

It is informed to the simulated bus manager on the master side that the simulated microcomputer 10 is connected with the simulated bus manager on the slave side.

The informed simulated bus manager on the master side, after the connection with the simulated bus manager on the slave side through the socket communication, sets to the inter-program communication handle management table the slot application name of the simulated microcomputer 10 and the name of computer implementing the simulated microcomputer 10. That is to say, as shown in FIG. 31A, in the inter-program communication handle management table on the master side, the slot application name "micon" is correlated with the computer name "Pana1" representing the computer 50a.

Next, the simulated device application task 200 starts up. The simulated device application task 200 calls the inter-program communication task starter function as indicated by the solid thick arrow Y30 in FIG. 25. The inter-program communication task starter function prepares the inter-program communication receive task 201 as indicated by the dashed thick arrow Y31 in FIG. 25. The inter-program communication receive task 201 executes the steps from S601 to S604. However, as indicated by the solid thin arrow Y 32 in FIG. 25, what the inter-program communication receive task 201 requests to connect with is the inter-program communication receive task 301M.

At this time, since the receive type is the connection, the inter-program communication receive task 301M executes the steps S4071 and S4072. In result, the content of the inter-program communication handle management table on the master side shows that the slot application name "remocon" representing the simulated device 20 is correlated with the inter-program communication handle "handle_remocon", as shown in FIG. 31B.

And the simulated bus manager on the master said is connected with the simulated device 20, which is informed to the simulated bas manager on the slave side.

After the informed simulated bus manager on the slave side is connected with the simulated bus manager on the master side through the socket communication, the slot application name of the simulated device 20 and the name of computer implementing the simulated device 20 are set to the inter-program communication handle management table. That is to say, as shown in FIG. 30B, in the inter-program communication handle management table on the slave side, the slot application name "remocon" is correlated with the computer name "PanaMaster" representing the computer 50b.

Next, in this embodiment 5, the data is outputted from the simulated device 20, and the simulated microcomputer takes this opportunity to receive the data, which procedure is explained hereinafter. In this case, the data communication is carried out by the asynchronous transmission, too.

Figure 29:
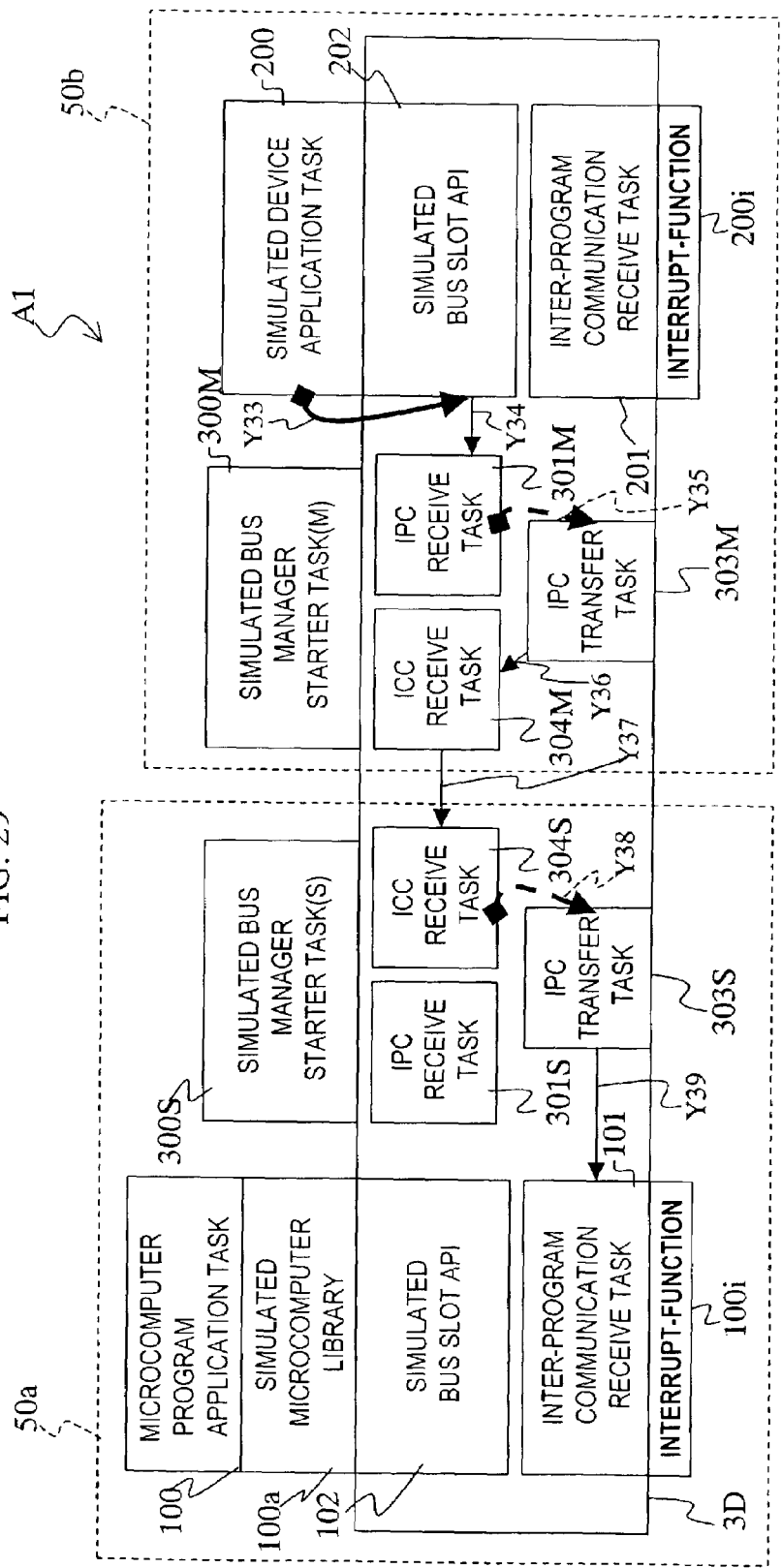
FIG. 29 is a diagram explaining the asynchronous communication of the simulated microcomputer board in the embodiment 5.

First of all, the simulated device application task 200 of the simulated device 20 calls the inter-program transmittal function with the transmittal data attached, as indicated by the solid thick arrow Y33 in FIG. 29. The transmittal data comprises a source application name, a destination application name, the communication type, and data. For instance, the source application name is "remocon" representing the simulated device 20, the destination application name is "micon" representing the simulated microcomputer 10, and the communication type is the "asynchronous".

The inter-program transmittal function executes the step S1201, and then transmits the transmittal data to the inter-program communication receive task 301M in the step S1203, as indicated by the solid thin arrow Y34 in FIG. 29.

The inter-program communication receive task 301M prepares the inter-program communication transfer task 303M, as indicated by the dashed thick arrow Y35. The inter-program communication receive task 303M extracts the destination application name from the transmittal data. Next, the slot application name corresponding to the extracted destination application name is searched from the inter-program communication handle management table on the master side. If the slot application name is found, the inter-program communication handle or the compute name, which are correlated with the slot application name, is extracted. In this case, since the transmittal application name is "micon", it is the computer name "Pana1" that is extracted on the basis of the inter-program communication handle management table in FIG. 31B. If the computer name is extracted instead of the inter-program communication handle, the inter-program communication receive task 303M transmits the computer name and the transmittal data to the inter-computer communication receive task 304M, as indicated by the solid thin arrow Y36 in FIG. 29. The inter-computer communication receive task 304M searches the inter-computer communication handle management table on the master side, and then extracts the inter-computer communication handle correlated with the received computer name. In this case, since the computer name is "Pana1", the inter-computer communication handle "hPana1" is extracted as shown in FIG. 30A. The inter-computer communication receive task 304M issues the request to send data to the inter-computer communication system according to the extracted inter-computer communication handle, and then transmits the transmittal data to the inter-computer communication receive task 304S on the slave side, as indicated by the solid thin arrow Y37 in FIG. 29.

When the transmittal data is received, the inter-computer communication receive task 304S prepares the inter-program communication transfer task 303S as indicated by the dashed thick arrow Y38 in FIG. 29. The inter-program communication transfer task 303S extracts the destination application name from the transmittal data. Next, the slot application name corresponding to the extracted destination application name is searched from the inter-program communication handle management table on the slave side. If the slot application name is found, the inter-program communication handle or the computer name correlated with,the extracted slot application name is extracted. In this case, as the destination application name is "micon", it is the inter-program communication handle "handl_micron" that is extracted as shown in FIG. 30B. And the transmittal data is transmitted to the inter-program communication receive task 101 according to this inter-program communication handle, as indicated by the solid thin arrow Y39 in FIG. 29.

Additionally, the simulated microcomputer 10 executes the interrupt-function in the same way as the embodiment 1.

Even when the simulated microcomputer boards are made to work on plural computers as above, it is possible to perform the asynchronous communication. Likewise, it is possible to perform the synchronous communication. At this time, since the IP address of computer and the like are hidden by the application name, it is possible to ensure the high preparation efficiency, reusability, and portability.

Besides, it is arranged in the embodiment 1 that the communication route including a source and a destination is specified by means of the slot application name only according to the inter-program communication handle management table. On the contrary, in the embedment 5, the inter-computer communication handle management table is also used for specifying the communication route. In addition, even in case of three computers and more, the invention can be applied, too.

Others

In the above respective embodiments, the bus 3 for connecting the microprocessor 1 and the device 2 of the remote controller 2a is simulated, however, the invention is not restricted to this. It is possible to apply the invention to the program for simulating the other device and the like.

Additionally, it may be arranged that the number of the microprocessors and the devices 2 are plural.

Moreover, in case of simulating not only the communication between the microprocessor and the device but also the communication between plural processors or between plural devices, the invention can be applied, too.

Figure 32:
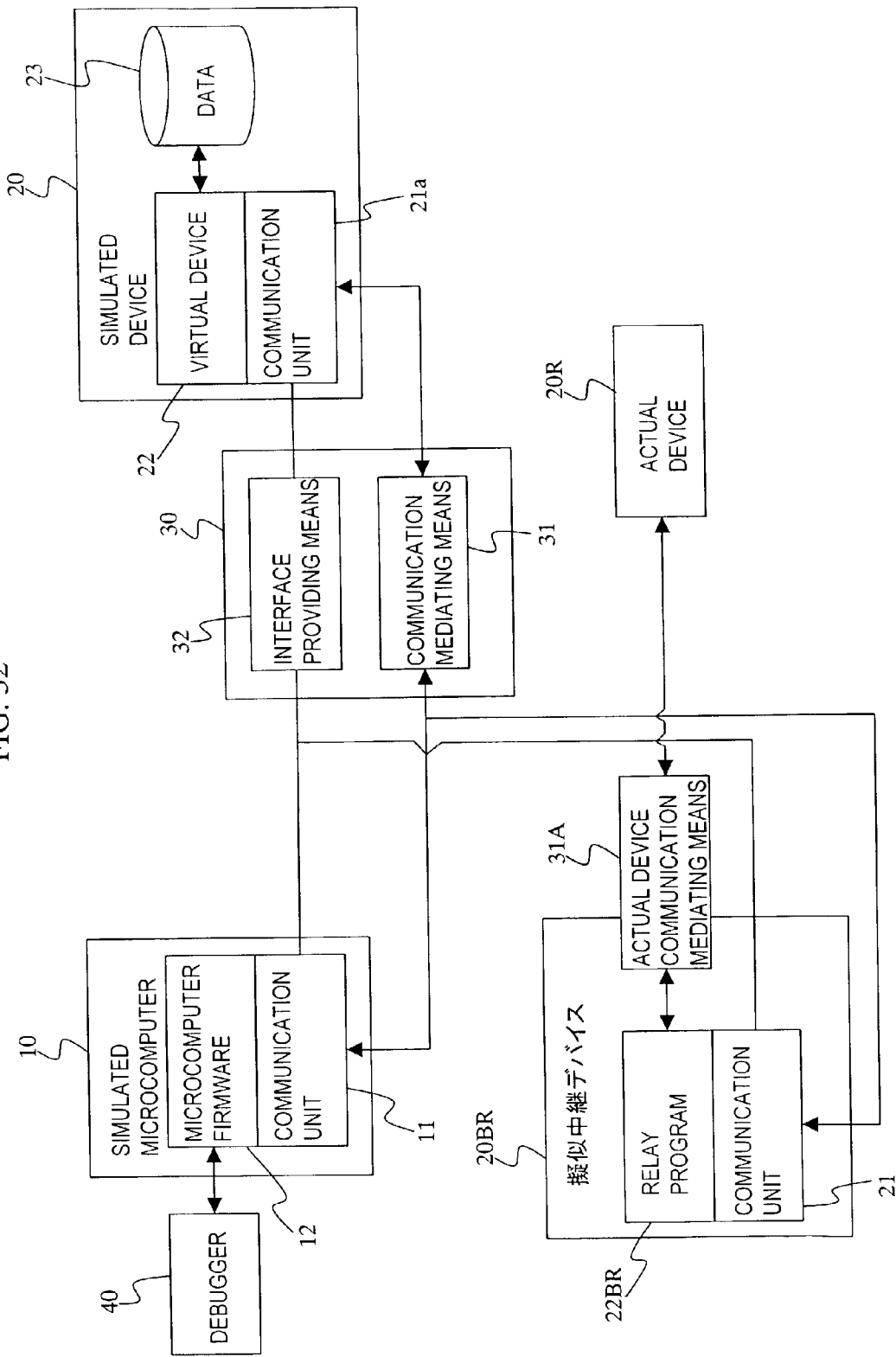
FIG. 32 is a diagram showing the schematic configuration of the bus simulation apparatus connected with an actual device.

Furthermore, the simulated device is replaced with a simulated bridge for bridging an actual bus connecting between actual devices and the simulated bus; thereby it is possible to perform the communication between the actual device and the simulated microcomputer. As shown in FIG. 32, the simulated bridge 20BR includes a relay program 22BR. The relay program 22BR relays the communication between the communication unit 21 and the actual device communication mediating means 31A. The relay program 22BR provides the data from the communication unit 21 to the actual device communication mediating means 31A, while provides the data from the actual device communication mediating means 31A to the communication unit 21. The actual device communication mediating means 31A transmits the data provided by the relay program 22BR through an actual bus to the actual device 20R, while provides the data provided by the actual device 20R through an actual bus to the relay program 22BR. The actual device communication mediating means 31A can be carried out by a controller of the actual bus and a driver controlling the controller. The controller and the actual device 20R are connected by means of Ethernet, SCSI (Small Computer System Interface), IEEE1394 (Institute of Electrical and Electronics Engineers 1394), USB (Universal Serial Bus), a general interface such as a serial I/F and parallel I/F, and a dedicated connecting member. Under such configuration, the simulated microcomputer executes the broadcast communication with both the actual device and the simulated device equivalent to the actual device; thereby it is also possible to perform the testing and debugging operations while comparing the actual device and the simulated device.

In addition, it is arranged in the above-mentioned respective embodiments that the simulated microcomputer and the simulated device be distinguished according to the slot application name; however, it is not restricted to this. For instance, those may be distinguished by means of a unique number of each program.

As described above, the invention can centralize the implementation regarding the inter-program communication corresponding a microprocessor or a peripheral device. This improves the preparing efficiency, the portability and the reusability of program. Consequently it is possible to improve the operating performance for the testing and the debugging remarkably. And it is also possible to restrain the influence based on the increase of the microprocessor and the peripheral device. Furthermore, since it is arranged in the invention that each communication of program be mediated, it is possible to restrain the influence caused by the starting order of programs of each connected-device.

Where the communication mediating means is provided with a specifying table, the information essentially required by the communication is hidden by the ID code, and in result the program of the connected-device is not necessary to depend on the information. Accordingly, it is possible to improve the preparation efficiency, the portability and the reusability of the program.

The ID code and the interrupt-function are correlated with each other according to the function management table, thereby it is possible to perform the asynchronous communication or the synchronous communication by means of the interrupt-function.

Additionally, the export-function for publishing a specific function is correlated with the ID code; thereby even a program of connected-device not including a specific function can utilize such specific function.

The communication route between programs of connected-devices is defined by the communication definition file, thereby without the reconstruction of the program the communication route can be changed and added by editing the communication definition file.

Even if plural programs of connected-devices work on different information processors, the communication between information processors is performed by the communication between respective communication mediating means included in each information processor, and thereby it is not necessary to make the programs of connected-devices depend on information necessary for the communication between information processors. Therefore, even if the plural programs of connected-devices work on different information processor, it is possible to improve the preparation efficiency, the portability and the reusability of the program of connected-device.

What is claimed is:

1. A bus simulation apparatus for simulating a bus connecting a plurality of devices, said bus simulation apparatus comprising:
   a plurality of simulated bus slot application interfaces each configured to prepare a receive task in response to a call from a simulated device, said simulated device corresponding to each of the plurality of the devices, said receive task obtaining a communication handle for an application name of the simulated device;

a communication handle management table configured to relate the communication handle to the application name; and a simulated bus manager configured to, in response to a request for data transfer between the simulated devices along with the application name, send data to the receive task of destination using the communication handle obtained by searching the communication handle management table based on the received application name.

2. A bus simulation apparatus according to claim 1, further comprising:

an interrupt function management table configured to relate the application name to a pointer to an interrupt function, wherein the simulated device, in response to the application name from another simulated device, searches the interrupt function management table to execute the interrupt function.

3. A bus simulation apparatus according to claim 2, wherein the interrupt function management table relates the application name to a pointer to an export-function for taking a specific function public to said another simulated device, and in response to a name of the export-function as the application name from said another simulated device, the simulated device searches the interrupt function management table to execute the export-function.

4. A bus simulation apparatus according to claim 1, further comprising a communication definition file configured to define a communication route between the simulated devices, wherein in response to the application name from the simulated device, the simulated bus manager refers to the communication file to change or add the communication route.

5. A bus simulation apparatus according to claim 4, further comprising a transfer management table relates an original application name to a changed application name, said transfer management table being prepared based on the communication definition file, wherein in response to the application name from the simulated device, the simulate bus manager searches the transfer management table for the changed application name, and searches the communication handle management table based on the changed application name.

6. A bus simulation apparatus according to claim 4, further comprising:

a broadcast transmittal management table relates the application name to another application name for broadcast transmittal, said broadcast transmittal management table being prepared based on the communication definition file, wherein in response to the request for data transfer between the simulated devices along with the application name, the simulated bus manager searches the broadcast transmittal management table for said another application name based on the received application name, and sends data to the receive tasks of destination using the communication handles obtained by searching the communication handle management table based on the received application name and said another application name.

7. A bus simulation apparatus according to claim 1, wherein in case of the simulated devices being on different information processors, a communication between the information processors is performed by a communication between the simulated bus managers on the information processors.

8. A computer readable medium storing a bus simulation program making a computer operate as a bus simulation apparatus according to claim 1.

* * * * *